(12) United States Patent
Lien et al.

(10) Patent No.: US 7,050,317 B1
(45) Date of Patent: May 23, 2006

(54) CONTENT ADDRESSABLE MEMORY (CAM) DEVICES THAT SUPPORT POWER SAVING LONGEST PREFIX MATCH OPERATIONS AND METHODS OF OPERATING SAME

(75) Inventors: Chuen-Der Lien, Los Altos Hills, CA (US); Kee Park, San Jose, CA (US); Scott Yu-Fan Chu, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 69 days.

(21) Appl. No.: 10/927,453

(22) Filed: Aug. 26, 2004

Related U.S. Application Data

(63) Continuation-in-part of application No. 10/386,400, filed on Mar. 11, 2003, now Pat. No. 6,839,256.

(60) Provisional application No. 60/364,694, filed on Mar. 15, 2002.

(51) Int. Cl.
G11C 15/00 (2006.01)

(52) U.S. Cl. .................... 365/49; 365/189.05; 711/108

(58) Field of Classification Search .................... None
See application file for complete search history.

(56) References Cited

U.S. PATENT DOCUMENTS

| | | | | |
|---|---|---|---|---|
| 4,723,224 A | * | 2/1988 | Van Hulett et al. ............ | 365/49 |
| 5,239,642 A | * | 8/1993 | Gutierrez et al. ............ | 711/207 |
| 5,327,372 A | | 7/1994 | Oka et al. ...................... | 315/49 |
| 5,446,685 A | | 8/1995 | Holst ........................... | 365/49 |
| 5,517,441 A | | 5/1996 | Dietz et al. ................... | 365/49 |
| 5,598,115 A | | 1/1997 | Holst ........................... | 326/119 |
| 5,706,224 A | | 1/1998 | Srinivasan et al. ............ | 365/49 |
| 5,852,569 A | | 12/1998 | Srinivasan et al. ............ | 365/49 |
| 5,859,791 A | | 1/1999 | Schultz et al. ................ | 365/49 |
| 5,936,873 A | | 8/1999 | Kongetira ...................... | 365/49 |
| 5,964,857 A | | 10/1999 | Srinivasan et al. ......... | 710/126 |
| 5,978,246 A | | 11/1999 | Shindo ......................... | 365/49 |
| 6,044,005 A | | 3/2000 | Gibson et al. ................ | 365/49 |
| 6,101,115 A | | 8/2000 | Ross ............................ | 365/49 |
| 6,101,116 A | | 8/2000 | Lien et al. .................... | 365/49 |
| 6,125,049 A | | 9/2000 | Nataraj ........................ | 365/49 |
| 6,128,207 A | | 10/2000 | Lien et al. .................... | 365/49 |
| 6,147,891 A | | 11/2000 | Nataraj ........................ | 365/49 |
| 6,154,384 A | * | 11/2000 | Nataraj et al. ................ | 365/49 |
| 6,166,939 A | | 12/2000 | Nataraj et al. ................ | 365/49 |
| 6,175,514 B1 | | 1/2001 | Henderson et al. ........... | 365/49 |
| 6,191,969 B1 | | 2/2001 | Pereira ......................... | 365/49 |
| 6,191,970 B1 | | 2/2001 | Pereira ......................... | 365/49 |
| 6,240,001 B1 | | 5/2001 | Ross ............................ | 365/49 |
| 6,243,280 B1 | | 6/2001 | Wong et al. ................... | 365/49 |
| 6,256,216 B1 | | 7/2001 | Lien et al. .................... | 365/49 |
| 6,262,907 B1 | | 7/2001 | Lien et al. .................... | 365/49 |
| 6,262,929 B1 | | 7/2001 | Miyatake et al. ............ | 365/203 |
| 6,324,087 B1 | | 11/2001 | Pereira ......................... | 365/49 |

(Continued)

*Primary Examiner*—Tan T. Nguyen
(74) *Attorney, Agent, or Firm*—Myers Bigel Sibley & Sajovec

(57) ABSTRACT

Content addressable memory (CAM) devices include at least one CAM array having a plurality of columns of ternary CAM cells therein. A bit/data line driver circuit, which receives search words and write words, is electrically coupled to the CAM array. The bit/data line driver circuit is configured to save power by logically combining incoming search words with a global mask that designates locations of active ones of the plurality of columns having exclusively locally masked CAM cells at valid entries therein. The bit/data line driver circuit includes a global mask generator configured to receive write words to be added to the CAM array during respective write operations.

22 Claims, 20 Drawing Sheets

U.S. PATENT DOCUMENTS

| | | |
|---|---|---|
| 6,341,079 B1 | 1/2002 | Chadwick .................... 365/49 |
| 6,343,029 B1 | 1/2002 | Kengeri et al. ............... 365/49 |
| 6,349,049 B1 | 2/2002 | Schoy ......................... 365/49 |
| 6,362,990 B1 | 3/2002 | Gibson et al. ................ 365/49 |
| 6,362,993 B1 | 3/2002 | Henderson et al. ........... 365/49 |
| 6,370,613 B1 | 4/2002 | Diede et al. ................ 711/108 |
| 6,373,737 B1 | 4/2002 | Lysinger ..................... 365/49 |
| 6,373,738 B1 | 4/2002 | Towler et al. ................ 365/49 |
| 6,381,162 B1 * | 4/2002 | Peterson ..................... 365/49 |
| 6,388,909 B1 * | 5/2002 | Takahashi et al. ............ 365/49 |
| 6,389,506 B1 | 5/2002 | Ross et al. .................. 711/107 |
| 6,430,074 B1 | 8/2002 | Srinivasan ................... 365/49 |
| 6,452,822 B1 | 9/2002 | Chai et al. ................... 365/49 |
| 6,460,112 B1 * | 10/2002 | Srinivasan et al. ......... 711/108 |
| 6,499,081 B1 | 12/2002 | Nataraj et al. .............. 711/108 |
| 6,502,163 B1 | 12/2002 | Ramanjutty ................. 711/108 |
| 6,542,392 B1 * | 4/2003 | Yanagawa ..................... 365/49 |

* cited by examiner

CONTENT ADDRESSABLE MEMORY (CAM) DEVICES THAT SUPPORT POWER SAVING LONGEST PREFIX MATCH OPERATIONS AND METHODS OF OPERATING SAME

REFERENCE TO PRIORITY APPLICATION

This application is a continuation-in-part of U.S. application Ser. No. 10/386,400, filed Mar. 11, 2003 now U.S. Pat. No. 6,839,256, which claims priority to U.S. Provisional Application Ser. No. 60/364,694, filed Mar. 15, 2002, the disclosures of which are hereby incorporated herein by reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., assigned to the present assignee, the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

As illustrated by FIG. 1A, a conventional ternary CAM cell 10 may include a data SRAM cell 12, a mask SRAM cell 16, a compare circuit 14 and an NMOS transistor 18 that is electrically connected in series between the compare circuit 14 and a respective match line. As will be understood by those skilled in the art, data can be loaded into the data SRAM cell 12 by driving a pair of differential bit lines BIT and BITB with a rail-to-rail data signal (i.e., BIT=1, BITB=0 or BIT=0, BITB=1) and driving a respective main word line at an active high level. These driving operations will cause the outputs D and DB of the data SRAM cell 12 to remain at or switch to levels consistent with the value of the rail-to-rail data signal established on the respective pair of bit lines. An active mask value can be loaded into the mask SRAM cell 16 by driving the pair of differential bit lines BIT and BITB with a rail-to-rail mask signal that reflects a logic 0 value (i.e., BIT=0, BITB=1) and driving a respective mask word line at an active high level. These driving operations will cause the true and complementary outputs M and MB of the mask SRAM cell 16 to remain at or switch to logic 0 and logic 1 levels, respectively. As will be understood by those skilled in the art, setting M=1 will operate to turn on NMOS transistor 18 and cause the CAM cell 10 to operate as a conventional binary CAM cell. However, setting M=0 will operate to turn off NMOS transistor 18 and thereby preclude the compare circuit 14 from pulling down the match line to indicate a "miss" (i.e., inequality) between the bit of data stored within the data SRAM cell 12 and a bit of a comparand residing on the corresponding pair of differential data lines DATA and DATAB. In this latter case, the CAM cell 10 is treated as being actively masked and storing an "X" state, which represents a "don't care" condition. In some applications, the pair of differential bit lines and the pair of differential data lines may be electrically connected together as a single pair of bit/data lines.

A pair of ternary CAM cells 10' may also share a respective mask SRAM cell 16', as illustrated by FIG. 1B. Accordingly, setting the true output M of the mask SRAM cell 16' to an active logic 0 value will operate to locally mask both upper and lower data SRAM cells 12 within the illustrated pair of CAM cells 10' during each consecutive search operation. Groups of four (4) or (8) CAM cells within a respective column may also be locally masked by a shared mask cell that is located within the same column. Accordingly, whenever the shared mask cell is active during a search operation, local masking of all CAM cells within the corresponding group will be masked.

The aforementioned commonly assigned '613 patent to Diede et al. also discloses a segmented CAM array that is configured to perform pipelined search operations. Moreover, FIG. 7 of the '613 patent illustrates an external mask register that is used in combination with splitter logic to globally mask bits of an applied search word before multiple segments of the search word are supplied to pipeline registers associated with each segment of the CAM array.

SUMMARY OF THE INVENTION

Content addressable memory (CAM) devices according to embodiments of the present invention achieve high integration by utilizing a plurality of CAM arrays that each contain a CAM cell sub-array and a mask cell sub-array therein. According to a preferred aspect of these CAM devices, each row of mask cells within the mask cell sub-array can be selectively read onto global mask signal lines so that one or more columns of a corresponding binary CAM cell sub-array can be globally masked during a search operation. In particular, mask assertion circuitry, which extends within the mask cell sub-array, is provided to drive the global mask signal lines with global mask data. This global mask data is provided as input data to a bit/data line control circuit that drives bit and/or data lines of the CAM cell sub-array during read, write and search operations. In some embodiments, the CAM cell sub-array may comprise exclusively binary CAM cells, however, in other embodiments the CAM cells are ternary or quaternary CAM cells that have local mask cells therein.

To facilitate pipelined search operations, among other things, preferred embodiments include a CAM array having a segmented sub-array of dedicated mask cells and a segmented sub-array of CAM cells therein. For example, the segmented sub-array of dedicated mask cells may include a first segment of dedicated mask cells that spans xR columns of mask cells and a second segment of dedicated mask cells that spans xS columns of dedicated mask cells. Likewise, the sub-array of CAM cells may include a first segment of CAM cells that spans xR columns of CAM cells and a second segment of CAM cells that spans xS columns of CAM cells. The segmented sub-array of dedicated mask cells may also include a first plurality of latches that are configured to latch mask word line signals and read mask line signals generated by the first segment of dedicated mask cells. In a corresponding fashion, the segmented sub-array of CAM cells may include a second plurality of latches that are configured to latch match line signals and word line signals generated by the first segment of CAM cells.

In some other embodiments, a CAM array is provided having a segmented sub-array of dedicated mask cells and a segmented sub-array of binary, ternary and/or quaternary CAM cells therein. A mask assertion circuit is also provided. This mask assertion circuit is configured to read global mask data from the dedicated mask cells during a read mask operation. This read mask operation may be performed as a background operation that is performed in preparation for a subsequent search operation that uses the previously read mask.

In still other embodiments, a CAM device is provided with a CAM array having a segmented sub-array of dedicated mask cells and a segmented sub-array of binary, ternary and/or quaternary CAM cells therein. A bit/data line driver circuit is also provided. This driver circuit is electrically coupled to the CAM array by a plurality of pairs of bit lines and a plurality of pairs of data lines. The CAM array further includes means, responsive to at least one read mask signal, for reading global mask data from the dedicated mask cells during a first search operation. The driver circuit may also include means, responsive to a clock signal, for latching the global mask data during a second search operation that follows the first search operation.

Still further embodiments of the present invention include method of operating an integrated circuit device. These methods include comparing a xS segment of a first search word and a xR segment of a second search word with entries in a CAM array, while concurrently reading xS and xR segments of first and second mask words, respectively, stored within a mask cell sub-array. Following these operations, a xS segment of the second search word and a xR segment of a third search word are compared with entries in the CAM array. This latter comparison operation uses the xS and xR segments of the first and second mask words to globally mask one or more bit positions in the xS and xR segments of the second and third search words, respectively.

In other embodiments of the invention, a CAM device is provided that includes a plurality of CAM arrays therein. Each of these CAM arrays may have a first row of mask cells and a mask assertion circuit therein. The mask assertion circuit is electrically coupled to the first row of mask cells and receives a first mask retained by the first row of mask cells when the first mask is asserted in response to a respective read mask signal. The first row of mask cells may contain exclusively hard mask cells or exclusively soft mask cells (e.g., RAM mask cells) or combinations of hard and soft mask cells. The hard mask cells may be layout-fixed or one-time programmable cells. A bit/data line driver circuit is also provided. The bit/data line driver circuit has inputs that are electrically coupled to outputs of the mask assertion circuit. According to a preferred aspect of this embodiment, the bit/data line driver circuit drives a plurality of pairs of differential bit/data lines in the CAM array with a comparand containing one or more bits of an applied search word and one or more mask bits at locations specified by the first row of mask cells. Thus, if the applied search word is 1111 and the first row of mask cells is configured to retain a mask that equals (or is equivalent to) 1100, where "0" designates an actively mask bit position, then the comparand will be represented as 11xx during the search operation, where "X" designates a globally masked bit position that may be achieved by driving a corresponding pair of differential bit/data lines at logic 0 levels (i.e., BIT=BITB=0).

A preferred CAM array may also include a plurality of rows of hard and soft mask cells that define a respective mask cell sub-array. The mask assertion circuit may be configured so that each mask retained by a mask cell row may be asserted alone or in combination with a mask retained by another one of the plurality of rows of mask cells. This aspect of the mask assertion circuit may be achieved by including wired NOR circuitry having precharged high output nodes that are pulled low when one or more active mask bits in a corresponding column of mask cells are asserted.

These global masking operations may also be used to achieve substantial power savings when ternary CAM devices are used to perform longest prefix match (LPM) search operations in such applications as Classless Inter-Domain Routing (CIDR). Such LPM search operations, which are a particular form of "best match" (BM) search operations, may be performed in each of a plurality of full or partially full CAM array blocks having one or more columns of exclusively locally masked CAM cells for all valid entries therein. For such cases when local masking is present for all valid entries within an active column(s) (i.e., a column within a search path of the CAM array block and not an unused redundant column), it may not be necessary to repeatedly drive a pair of differential data lines (D and DB) with the corresponding bits from consecutively applied search words. Instead, it may be preferable to hold a pair of differential data lines in a global mask condition (e.g., D=DB=0) until at least one valid entry is added to the CAM array block with an unmasked bit in the position of the active column being globally masked. This global masking technique may result in substantial power savings for each of a plurality of CAM array blocks having entries therein with relatively large numbers of locally masked bits in overlapping bit positions, which is frequently the case in devices supporting LPM search operations or other types of best match search operations in CAM array blocks having ternary or quaternary CAM cells. In addition to global masking, alternative embodiments may include floating a pair of differential data lines associated with a column having exclusively locally masked CAM cells for all valid entries. In still further embodiments, the pair of differential data lines may be held at a fixed data value (0 or 1) to prevent switching of the pair of differential data lines during search operations.

In these embodiments, a CAM array is provided with a plurality of active columns of ternary CAM cells therein. A bit/data line driver circuit is electrically coupled to the CAM array. The bit/data line driver circuit is configured to apply an LPM-specific mask to incoming search words so that each of the plurality of active columns of ternary CAM cells having exclusively locally masked data in valid entry locations is globally masked during search operations. The bit/data line driver circuit may also include an LPM-specific global mask generator. This generator is configured to receive write words to be added to said CAM array during respective write operations. This generator includes an LPM-specific global mask register configured to store the LPM-specific mask. In other embodiments, the bit/data line driver circuit may be configured to logically combine incoming search words with a global mask that designates locations of active ones of the plurality of columns having exclusively locally masked CAM cells at valid entries in said CAM array.

DETAILED DESCRIPTION OF PREFERRED EMBODIMENTS

Figure 1A:
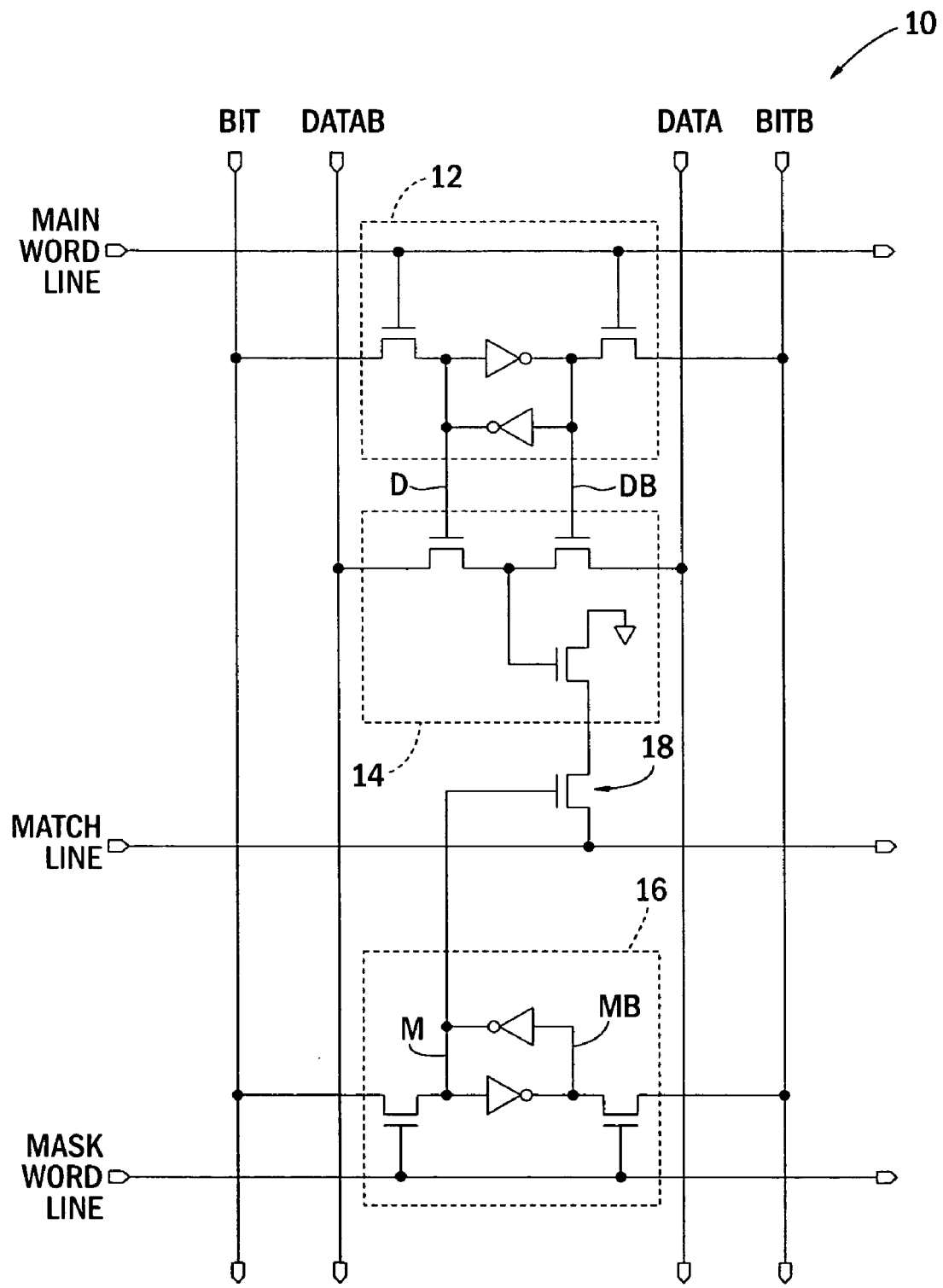
FIG. 1A is an electrical schematic of a conventional ternary CAM cell.
Figure 1B:
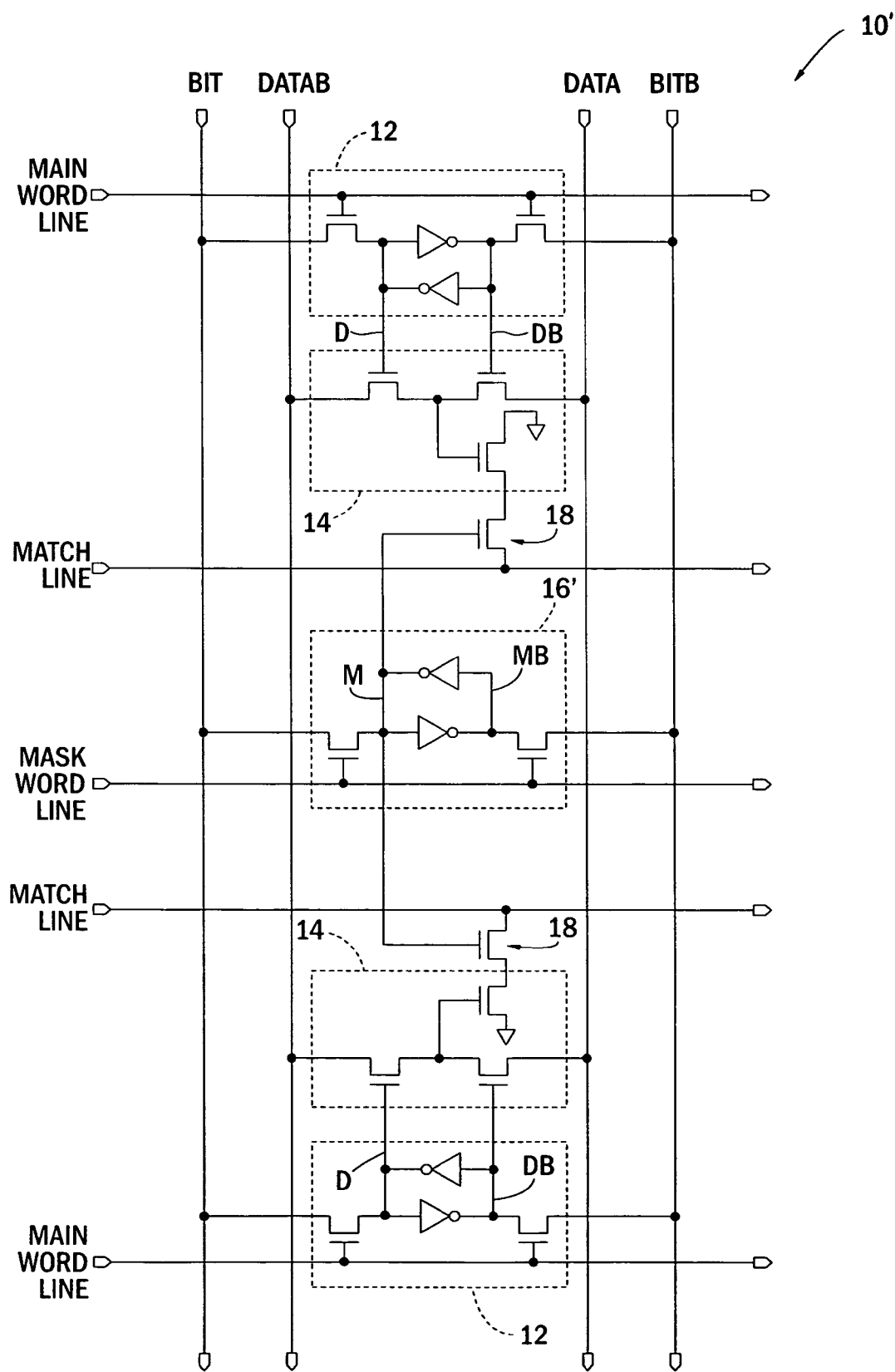
FIG. 1B is an electrical schematic of a plurality of ternary CAM cells that share a mask RAM cell in a conventional manner.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 2:
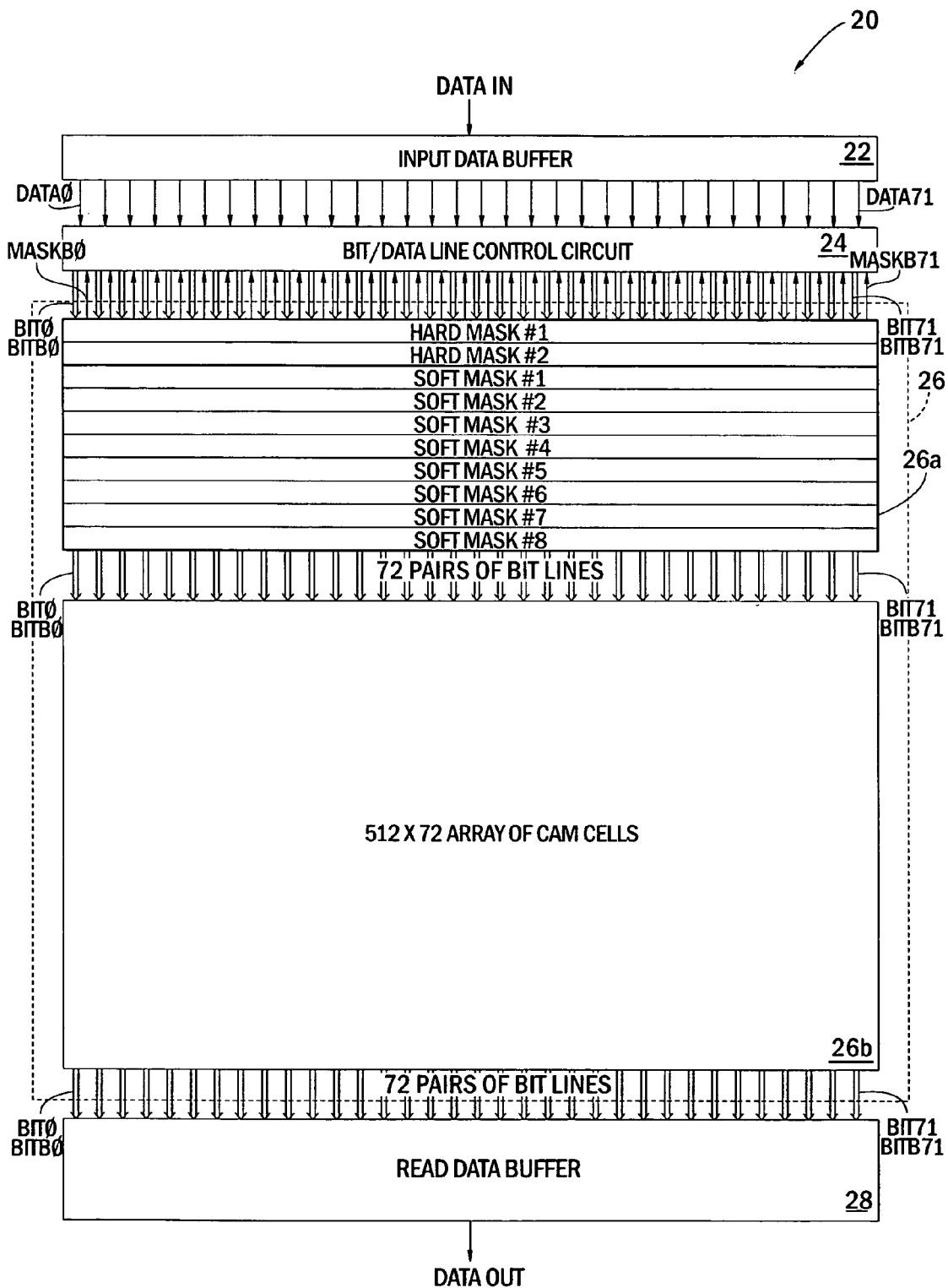
FIG. 2 is a block diagram of a CAM device according to an embodiment of the present invention.

Referring now to FIG. 2, a CAM device 20 according to an embodiment of the present invention will be described. The CAM device 20 includes an input data buffer 22, a bit/data line control circuit 24, a CAM array 26 and a data output buffer 28, connected as illustrated. In the illustrated embodiment, the data output buffer 28 is positioned below the other illustrated elements, however, in alternative embodiments, the data output buffer 28 may be positioned above the illustrated embodiments. A row control circuit (not shown) that generates word line, match line and pseudo-ground lines signals may also be provided adjacent one side of the CAM array 26. Pseudo-ground line signals may also be referred to as "low" match line (LM) signals, as explained more fully in U.S. Pat. No. 6,262,907 to Lien et al., entitled "Ternary CAM Cell," the disclosure of which is hereby incorporated herein by reference. In an alternative embodiment, the CAM array may comprise CAM cells that are not responsive to pseudo-ground line signals.

A bank of sense amplifiers (not shown) that receives match line signals and pseudo-ground line signals may be provided adjacent another side of the CAM array 26. A row priority encoder (not shown) may be electrically coupled to outputs of the bank of sense amplifiers. In alternative embodiments, inputs to the row priority encoder may be directly connected to the match lines within the CAM array 26 and the bank of sense amplifiers may be omitted. As will be understood by those skilled in the art, the row priority encoder may be configured to generate an address of a highest priority matching entry within the CAM array 26, in response to a search operation. Operations performed by a row control circuit and priority encoder are more fully described in U.S. Pat. No. 6,657,878 and U.S. application Ser. No. 10/306,799, to Lien et al., filed Nov. 27, 2002, the disclosures of which are hereby incorporated herein by reference.

The input data buffer 22 is preferably configured to buffer entries to be written into the CAM array 26 during write cycles and buffer search words to be applied (at least in part) to the CAM array 26 during respective search or "look-up" cycles. As described more fully in U.S. Pat. No. 6,760,242, the disclosure of which is hereby incorporated herein by reference, each of the write and search cycles may comprise a plurality of pipelined operations. These buffered entries and search words are provided as inputs to the bit/data line control circuit 24. Column driver circuitry that may be associated with each column of the bit/data line control circuit 24 is described more fully hereinbelow with respect to FIG. 4.

In the illustrated embodiment, the bit/data line control circuit 24 is electrically connected to the CAM array 26 by pairs of differential bit lines (shown as 72 pairs: (BIT0, BITB0)–(BIT71, BITB71)). These pairs of differential bit lines receive write data in the form of rail-to-rail signals during write operations and receive comparand data during search operations. The comparand data may be established using rail-to-rail signals and possibly one or more global mask bits. A global mask bit may be established by setting both true and complementary bit lines in a respective pair low (i.e., BIT=BITB=0). The pairs of differential bit lines may also be driven with logic 1 values upon commencement of a read operation (i.e., BIT=BITB=1).

A plurality of global mask signal lines MASKB, which are described herein as being active when low, are provided to communicate mask information from the CAM array 26 to the bit/data line control circuit 24. As illustrated, each of the 72 columns of the CAM array 26 generates a respective global mask signal (e.g., MASKB0–MASKB71). As described more fully hereinbelow with respect to FIG. 3A, these global mask signals may be generated by mask assertion circuitry that is located within a mask cell sub-array 26a. As illustrated by FIG. 2, the mask cell sub-array 26a may include multiple rows of hard mask cells, shown as two (2) rows of hard mask cells, and multiple rows of soft mask cells, shown as eight (8) rows of soft mask cells.

A CAM cell sub-array 26b is also provided within the CAM array 26. The CAM cell sub-array 26b is illustrated as having a capacity of 512×72 words (i.e., the CAM array 26 has a depth=512 and width=72). Additional columns (not shown) may also be provided for retaining parity bit information and/or check bit information that may be useful to perform soft error detection and correction when the entries in each row are read out and checked for soft errors. In preferred embodiments, each mask cell sub-array 26a shares signal lines (e.g., bit lines) with a respective CAM cell sub-array 26b. Nonetheless, in some alternative embodiments, the mask cell sub-array 26a may be positioned so that signal lines are not shared. For example, the mask cell sub-array 26a may be positioned between the input data buffer 22 and the bit/data line control circuit 24 or otherwise associated with each CAM array 26.

In the illustrated embodiment, the CAM cell sub-array 26b is a highly integrated array having relatively small CAM cells therein (e.g., binary CAM cells). However, in some applications, CAM cell sub-arrays 26b having a mixture of binary CAM cells and larger CAM cells (e.g., ternary CAM cells having local mask cells therein) or exclusively larger CAM cells may be used. The read data buffer 28 is electrically coupled by the plurality of pairs of differential bit lines to the CAM cell sub-array 26b. During a read operation, the bit/data line control circuit 24 drives the true and complementary bit lines within each pair to logic 1 values. If the read operation is dynamic, the outputs of the bit/data line control circuit 24 are then disposed in high impedance states. Alternatively, if the read operation is static, the outputs of the bit/data line control circuit 24 need not be disposed in high impedance states. A row of soft mask cells within the mask cell sub-array 26a or a row within the CAM cell sub-array 26b is then accessed during a read operation by driving a respective mask word line or data word line high. In response to this access, read data signals are established on the bit lines and received by sense amplifiers within the read data buffer 28 using conventional operations.

Figure 3A:
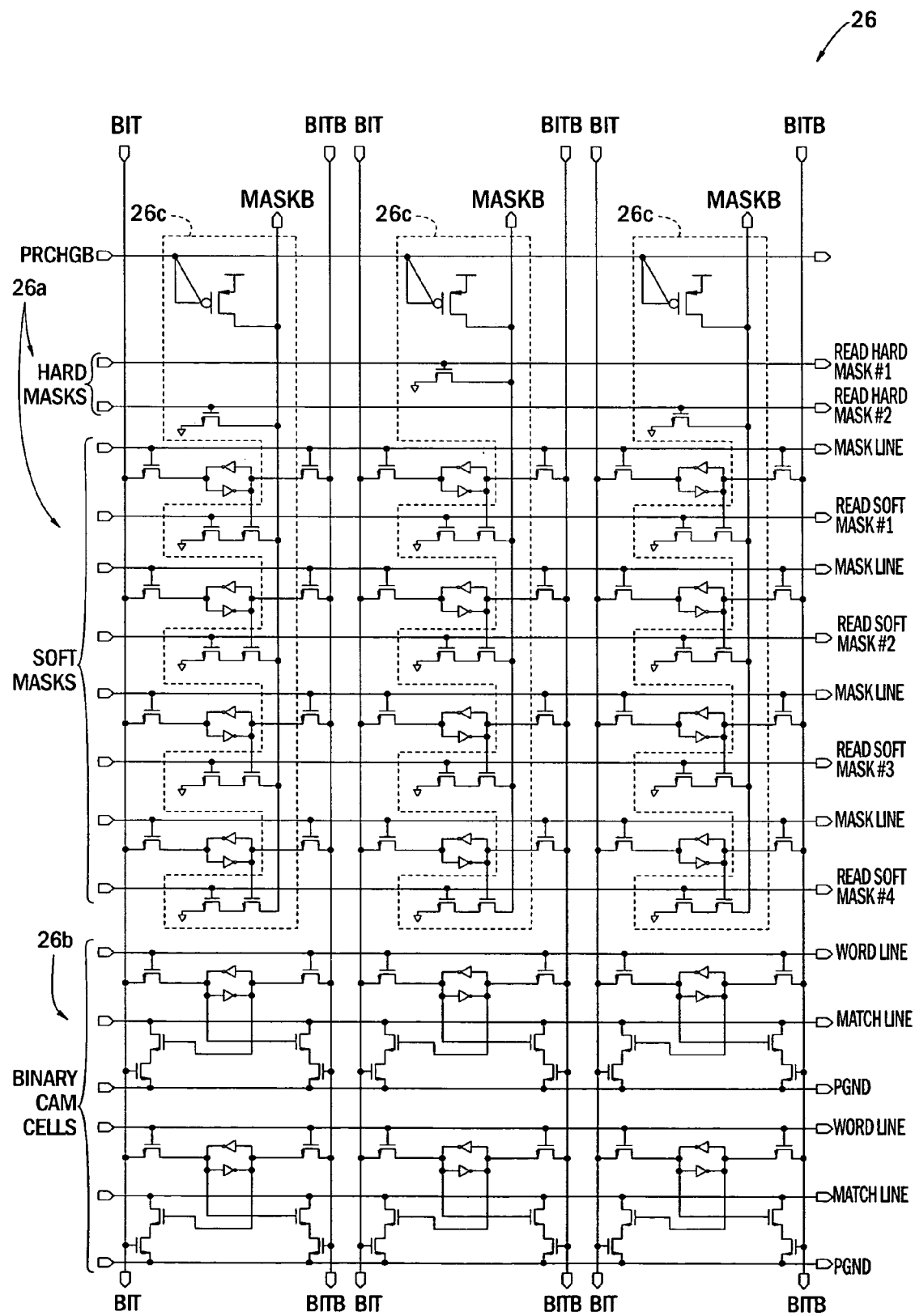
FIG. 3A is an electrical schematic of a CAM array according to an embodiment of the present invention.
Figure 3B:
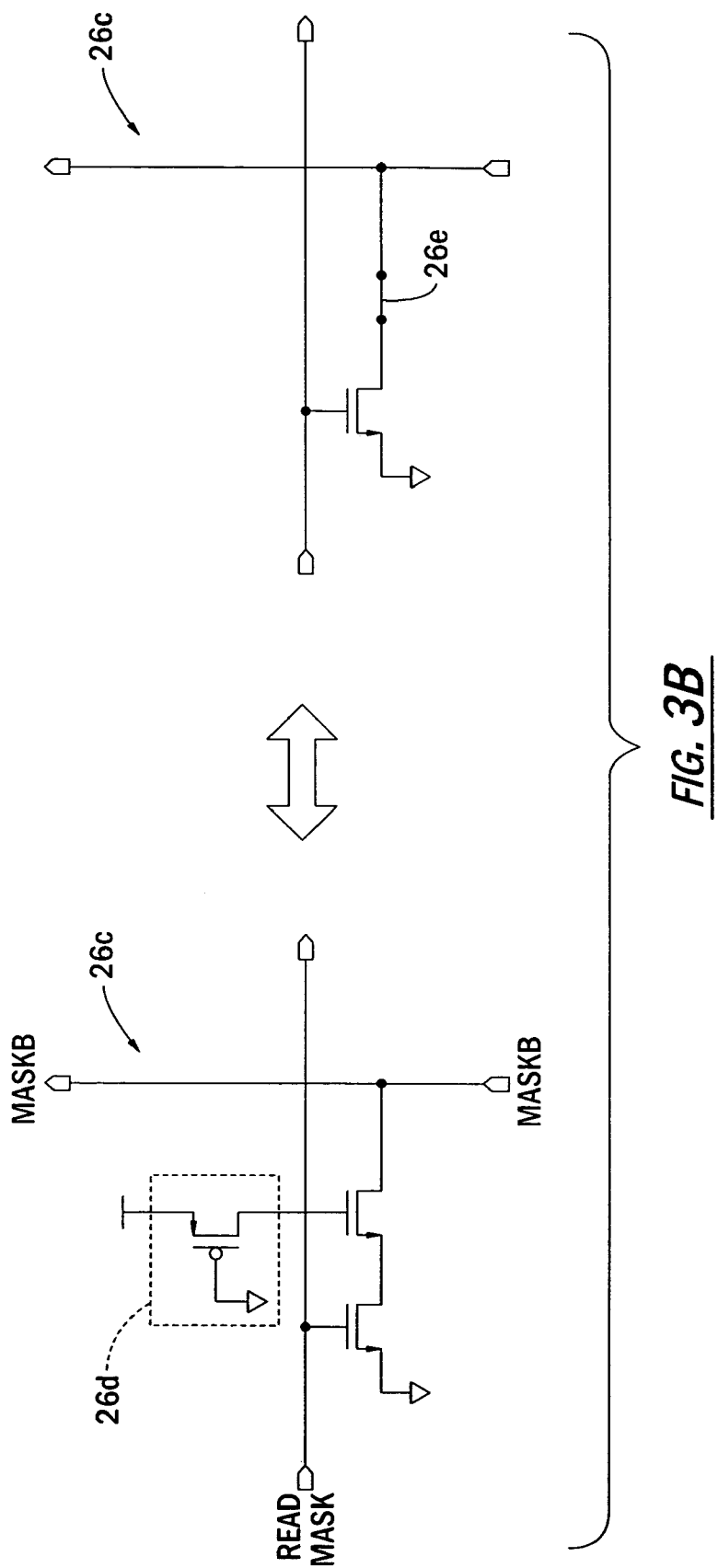
FIG. 3B is an electrical schematic of a single transistor hard mask cell that is connected to a portion of a mask assertion circuit and an equivalent circuit that operates as a hard mask cell.

FIG. 3A illustrates an exemplary SRAM-based CAM array 26 having hard and soft mask cells in a mask cell sub-array 26a and exclusively binary CAM cells in a CAM cell sub-array 26b. Alternative technologies, including DRAM and nonvolatile storage technologies, may also be used within the CAM array 26. The CAM cell sub-array 26b is illustrated as comprising 6 CAM cells that span a block of two rows and three columns. The mask cell sub-array 26a is illustrated as comprising 12 soft mask cells (shown as SRAM cells) that span a block of four rows and three columns. The mask cell sub-array 26a may also include a plurality of hard mask cells. As illustrated on the left side of FIG. 3B, these hard mask cells 26d may be represented by a single transistor. However, in a more preferred embodiment, the single transistor hard mask cell 26d and a portion of a respective mask assertion circuit 26c are replaced by an electrical conductor 26e. The electrical conductor 26e may be represented by a direct wiring connection, as illustrated, or by a fuse in the event a hard mask is one-time programmable. In the first row of soft mask cells, three programmable SRAM cells are provided. The gate electrodes of the access transistors associated with these three SRAM cells are electrically connected to a respective mask line, which operates as a conventional word line when writing to and reading from a row of soft mask cells. This mask line may also be referred to as a mask word line.

Referring again to FIG. 3A, each column of the mask cell sub-array 26a preferably comprises a mask assertion circuit 26c. The mask assertion circuit 26c includes the global mask signal lines MASKB, which are illustrated as extending in a vertical direction in parallel with the bit lines, and PMOS pull-up transistors. The global mask signal lines MASKB may be precharged high by the PMOS pull-up transistors. These pull-up transistors are responsive to a precharge control signal, shown as PRCHGB. The precharge control signal PRCHGB may be generated as an active low pulse during search operations. The mask assertion circuit 26c also includes a pair of NMOS transistors associated with each soft mask cell. As illustrated, the NMOS transistors in each pair are electrically connected in series between a respective global mask signal line MASKB and a ground reference potential. Accordingly, each pair of NMOS transistors is connected in a wired-NOR manner to a respective global mask signal line MASKB. A gate electrode of one NMOS transistor in a pair is electrically coupled to a complementary output of respective soft mask cell and a gate electrode of another NMOS transistor in the pair is electrically coupled to a respective read soft mask signal line. The NMOS transistors within each pair will become conductive if the following three conditions are met: (i) the respective global mask signal line MASKB is precharged high, (ii) the respective soft mask cell is storing an active mask value (M=0, MB=1) and (iii) the respective read soft mask signal line is active at a high level.

Based on the illustrated configuration of the soft mask cells and the mask assertion circuitry 26c within the mask cell sub-array 26a, operations to read a first soft mask associated with the first row of soft mask cells onto the global mask signal lines MASKB commence by driving the first read soft mask signal line (Read Soft Mask #1) high. If the soft mask retained by the first row of soft mask cells is {010}, the leftmost and rightmost of the three global mask signal lines MASKB illustrated by FIG. 3A will be pulled low (from precharged high levels). These low states will indicate that the leftmost and rightmost columns of the CAM cell sub-array 26b are to be masked during a subsequent (e.g., next following) search operation. A leading edge of a clock signal CLK can then be generated to latch the low or high logic levels on the global mask signal lines MASKB into a N-bit wide shift register (comprising flip-flops (FF)) (see, e.g., FIG. 4). This shift register may comprise D-type master-slave flip flops that provide valid output data on a trailing edge of the clock signal.

As another example, operations to simultaneously read a first soft mask associated with the first row of soft mask cells and a second soft mask associated with the second row of soft mask cells onto the global mask signal lines MASKB commence by driving the first and second read soft mask signal lines (Read Soft Mask #1, Read Soft Mask #2) high. If the soft mask retained by the first row of soft mask cells is {110} and the soft mask retained by the second row of soft mask cells is {100}, the center and rightmost of the three global mask signal lines MASKB illustrated by FIG. 3A will be pulled low (from precharged high levels) to thereby indicate that the center and rightmost columns of the CAM cell sub-array 26b are to be masked during a subsequent search operation.

As a final example, an operation to load a first hard mask associated with a first row of hard mask cells onto the global mask signal lines MASKB commences by driving the first read hard mask signal line (Read Hard Mask #1) high. In the illustrated embodiment, the operation to drive the first read hard mask signal line high will cause the center of the three global mask signal lines MASKB illustrated by FIG. 3A to be pulled low (from a precharged high level) to thereby indicate that the center column of the CAM cell sub-array 26b is to be masked during a subsequent search operation.

Figure 4:
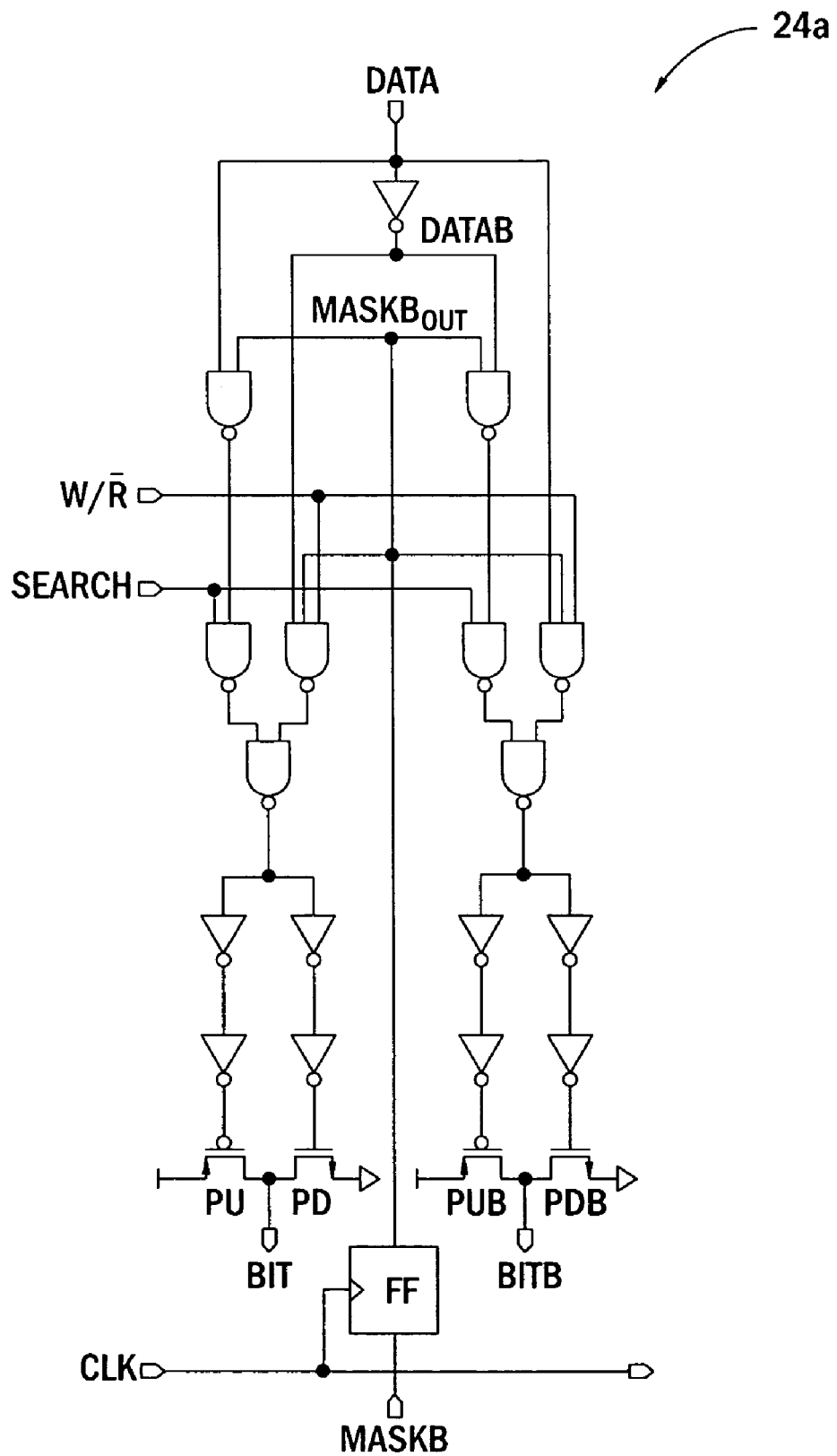
FIG. 4 is an electrical schematic of a column driver according to an embodiment of the present invention.

FIG. 4 is an electrical schematic of a portion of a bit/data line control circuit 24 that is responsive to a respective output of the mask assertion circuit 26c illustrated by FIG. 3A. In particular, FIG. 4 illustrates a column driver 24a that is electrically coupled to a respective pair of differential bit lines, shown as BIT and BITB, that span the CAM array 26. The column driver 24a is also configured to receive mask information from the mask cell sub-array 26a. As illustrated by the flip-flop (FF) at the bottom of FIG. 4, the mask information is loaded into the column driver 24a in-sync with a clock signal CLK. This column driver may also be referred to as a bit/data line driver circuit.

Based on the illustrated configuration of the column driver 24a, a read operation may include an operation to pull-up each pair of differential bit lines to logic 1 levels, by setting both the write control signal line W (/R) and the search control signal line SEARCH low. This read operation is performed while the output of the mask assertion circuit 26c, shown as MASKB, is maintained high. Conventional read operations may then include driving a word line associated with a desired row high and activating the read data buffer 28 to accept the read data established on the bit lines. Similarly, a write operation includes setting the write control signal line W high and the search control signal line SEARCH low (while the output of the mask assertion circuit 26c is maintained high). Under these conditions, the true and complementary bit lines BIT and BITB will be driven at levels that are consistent with the value of the input data DATA.

The performance of a search operation includes setting the write control signal line W low and the search control signal line SEARCH high. Under these conditions, the true and complementary bit lines BIT and BITB will be driven at levels that are consistent with the value of the input data DATA if the corresponding global mask signal line MASKB$_{OUT}$ is high. However, if the global mask signal line MASKB$_{OUT}$ is low, the true and complementary bit lines BIT and BITB will both be pulled low to indicate a global mask condition during the search operation. This global mask condition is typically read from the mask cell sub-array 26a during an immediately preceding search cycle.

Figure 5A:
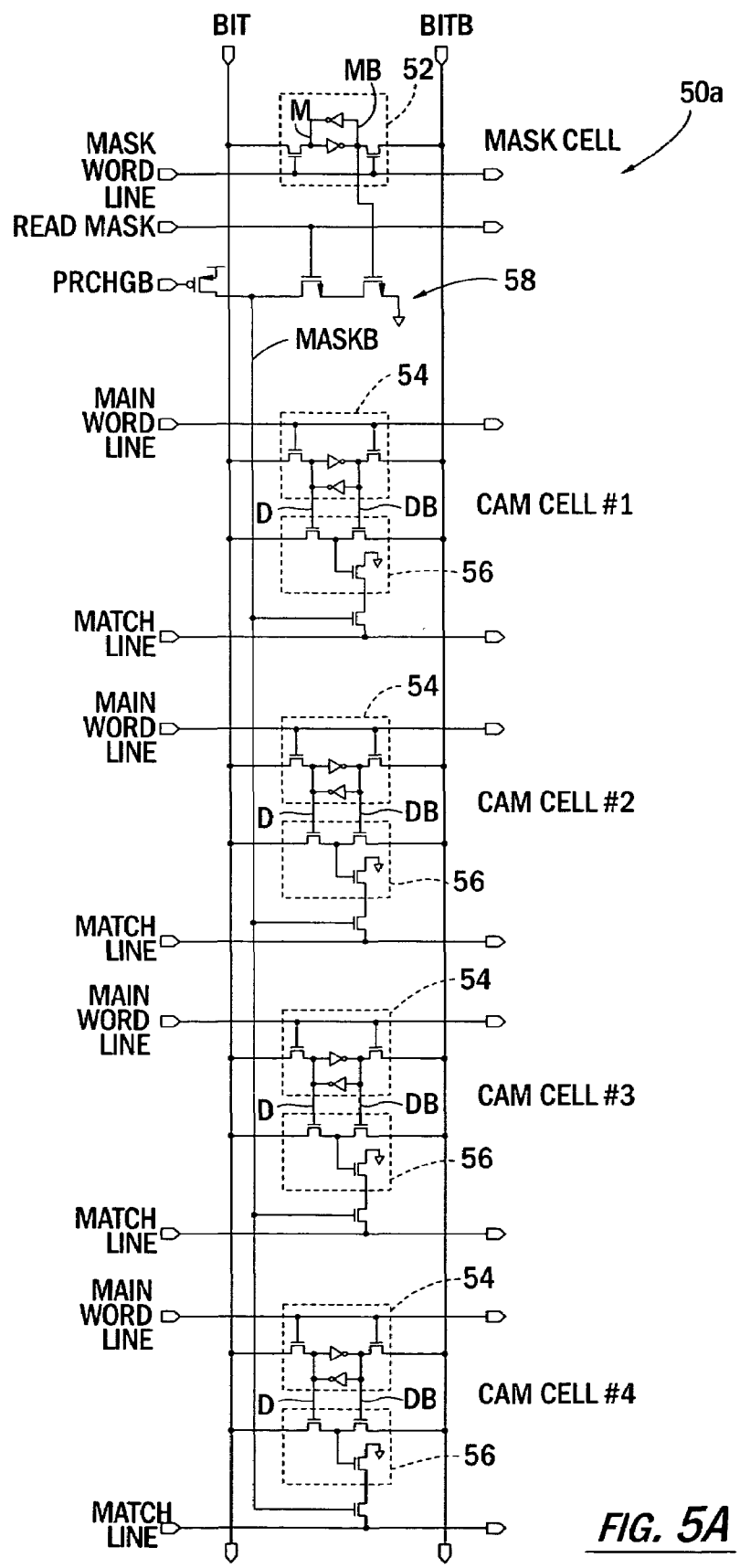
FIG. 5A is an electrical schematic of a plurality of binary CAM cells that can be selectively masked by a shared mask RAM cell, according to an embodiment of the present invention.
Figure 5B:
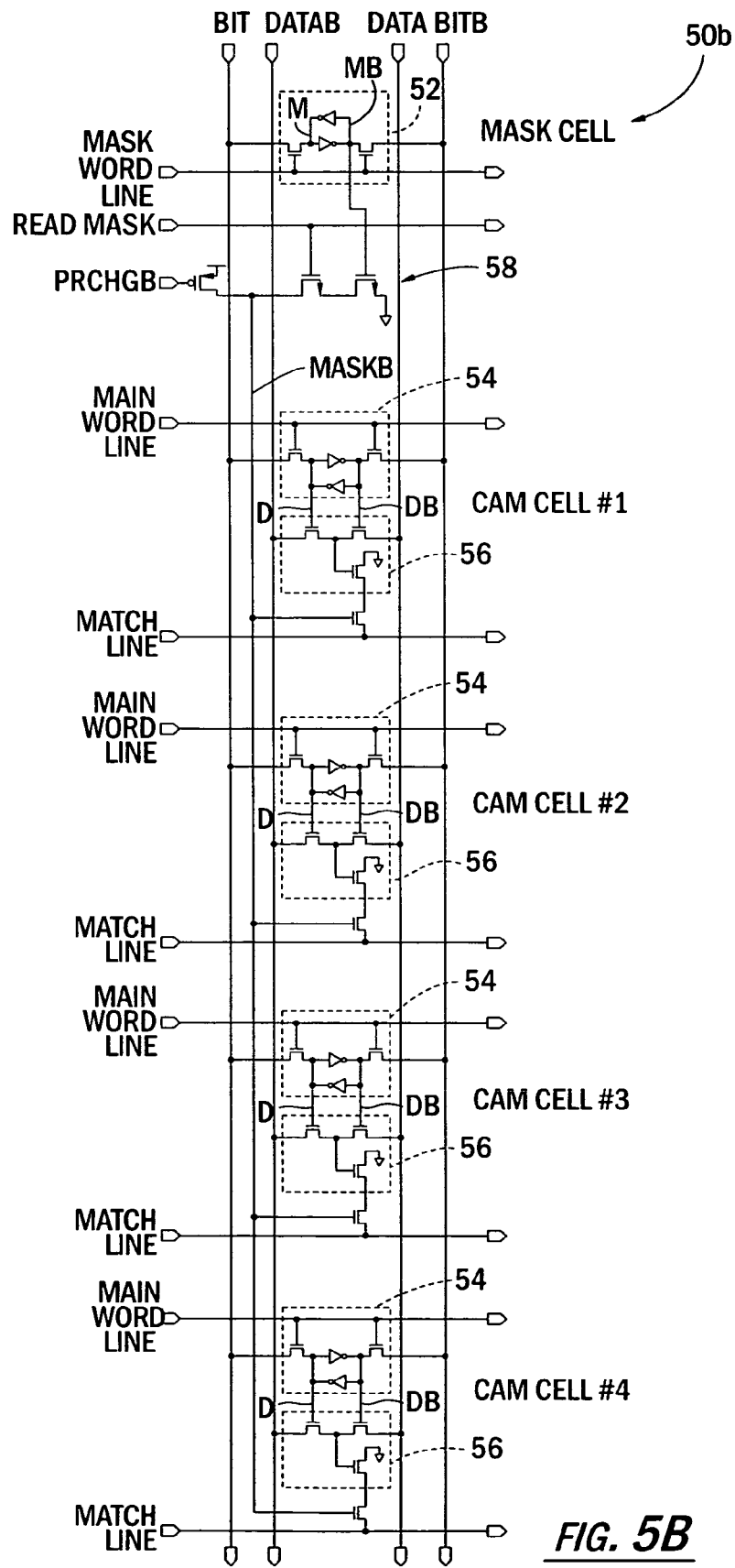
FIG. 5B is an electrical schematic of a plurality of binary CAM cells that can be selectively masked by a shared mask RAM cell, according to an embodiment of the present invention.

Referring now to FIG. 5A, a partial column 50a of a CAM array according to another embodiment of the present invention includes a mask cell 52 that operates to "locally" mask a plurality of CAM cells within a respective column. The CAM cells each include a data cell 54 and a compare circuit 56. The partial column 50a of FIG. 5A is similar to the partial column 50b of FIG. 5B, however, the compare circuit 56 within each CAM cell in FIG. 5B is connected to a separate pair of data lines DATA and DATAB that receive a respective bit of a comparand during a search operation. The use of a separate pair of data lines DATA and DATAB can advantageously reduce parasitic capacitance on the bit lines BIT and BITB and also enable a row of CAM cells within the CAM array to be read while a search operation is being performed.

The mask cell 52 and the CAM cells within the partial column 50a are illustrated as SRAM cells. A mask assertion circuit 58 is provided that includes a global mask signal line MASKB and a pair of NMOS transistors connected in series, as illustrated. A PMOS transistor, which is responsive to an active low precharge signal (PRCHGB), is also provided. The PMOS transistor operates to pull-up the global mask signal line MASKB prior to each search cycle. The precharge signal is an active low pulse in the illustrated embodiment. The value of the mask stored within the mask cell 52 can be read onto the global mask signal line MASKB by driving a respective read mask signal line (READ MASK) high.

In particular, if the mask cell 52 is storing an active mask value (i.e., M=0) when the read mask signal line is driven high, then both series connected NMOS transistors within the mask assertion circuit 58 will become conductive to pull-down the global mask signal line MASKB. When the global mask signal line MASKB is pulled low to represent that an active mask condition has been read from the mask cell 52, the four illustrated CAM cells become locally masked by the single mask cell 52. This local masking is achieved by blocking each compare circuit within the four illustrated CAM cells from pulling a respective match line (MATCH LINE) low from a precharged high condition. In contrast, if the global mask signal line MASKB remains high during a search operation, either because (i) the mask cell 52 is storing an active mask value that has not been read by driving the read mask signal line high or (ii) the mask cell 52 has been read but is nonetheless storing an inactive mask value (i.e., M=1), the four illustrated CAM cells operate as conventional binary CAM cells when a search operation is performed. In alternative embodiments, the CAM cells may comprise ternary CAM cells.

Figure 6A:
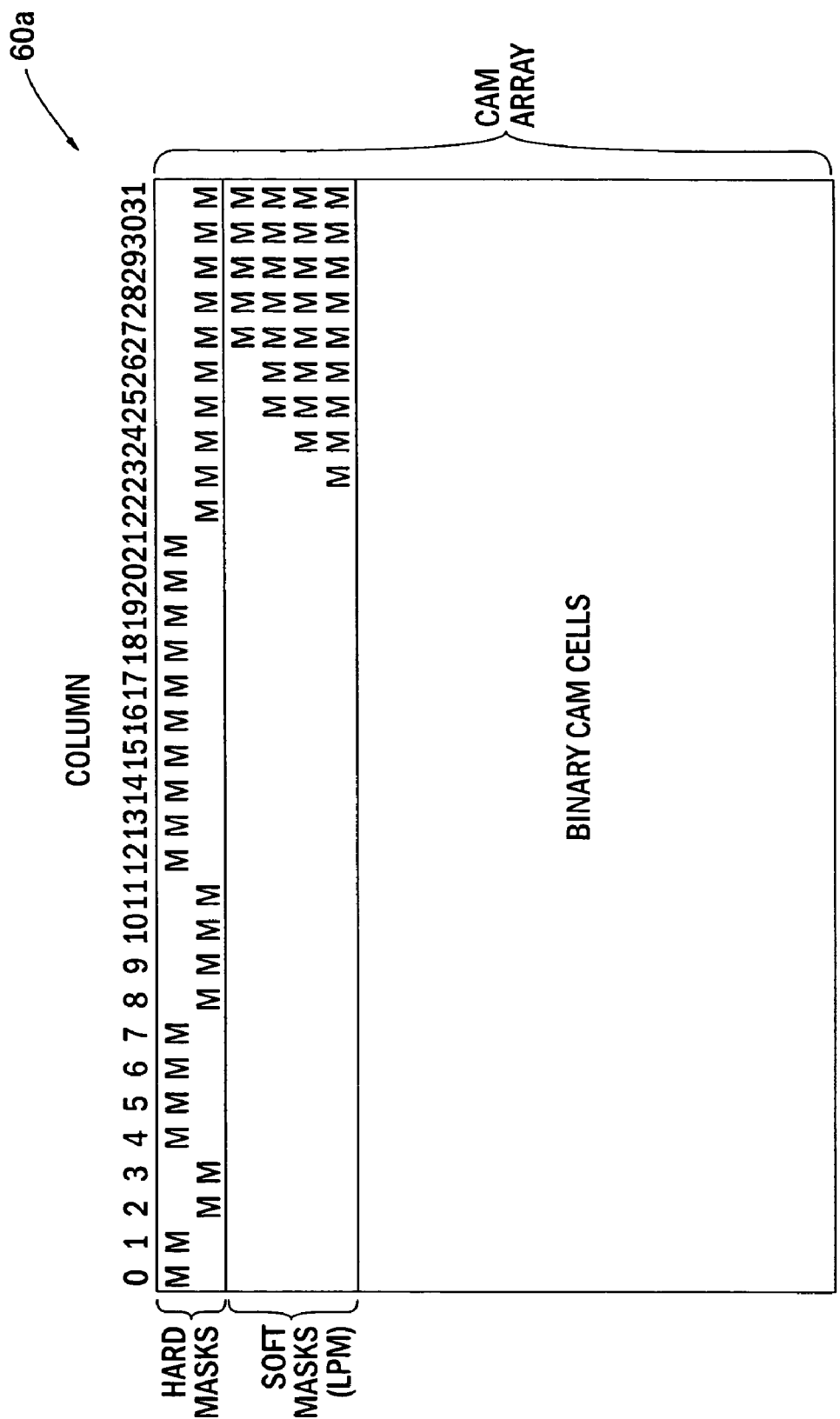
FIG. 6A is a block diagram of a CAM array according to an embodiment of the present invention.

FIG. 6A is a block diagram of a CAM array 60a according to another embodiment of the present invention. As illustrated, the CAM array 60a includes a binary CAM cell sub-array and a mask cell sub-array. The logical width of the CAM array 60a is shown as 32 bits. The mask cell sub-array includes a plurality of rows of hard mask cells (shown as 2) and a plurality of rows of soft mask cells (shown as 4). Each row of hard mask cells includes sixteen (16) actively masked bit positions that are segmented into three contiguous groups. These three contiguous groups may include xR, xS and xT segments of bits, where R, S and T are positive integers. For example, if a CAM array has a logical width of 72 bits, the groups may be partitioned as x3, x6 and x27 segments, where R=3, S=6 and T=27. In the illustrated embodiment of FIG. 6A, R=2, S=4 and T=10.

The use of 16 actively mask bit positions in the embodiment of FIG. 6A enables the performance of "short" x16 word searches (i.e., where the full logical width of an applied search word is less than a logical width of the CAM array). A first group of each row of hard mask cells contains two actively mask bit positions (shown as M) and a second group of each row contains four actively mask bit positions. The third group of each row contains ten actively masked bit positions. Each row of soft mask cells includes a different number of actively masked bit positions that extend adjacent a right side of the CAM array 60a. The soft masks retained by the rows of soft mask cells may be used during search operations to identify an address of a matching entry having a longest prefix match (LPM). Applications that require a CAM device to identify entries having longest prefix matches are more fully described in U.S. Pat. No. 6,665,202, the disclosure of which is hereby incorporated herein by reference.

According to a preferred aspect of this embodiment, a first x16 search operation may be performed on the CAM array 60a by masking columns 0–1, 4–7 and 12–21(or even columns) using a first hard mask that is applied during one search cycle within a pipelined search operation. Alternatively, a second x16 search operation may be performed by masking columns 2–3, 8–11 and 22–31 (or odd columns) using a second hard mask that is applied during another search cycle. These x16 search operations may be performed in a staged manner to conserve power. For example, the search cycle may be performed by applying the first hard mask and initially partially searching columns 2–3 of the CAM array during a first stage. If at least one x2 partial match is detected between the first two bits of the x16 applied search word and the data retained in columns 2–3 of the CAM array 60a during the first stage, then the search operation may continue to a second stage. Otherwise, the search operation terminates. During the second stage, the next four bits of the x16 search word are compared to the data contained within columns 8–11. If at least one x4 partial match is detected during the second stage, then the search operation continues to the final third stage. Otherwise, the search operation terminates after the second stage. During the final third stage, the remaining x10 segment of the x16 search word is compared to the data within columns 22–31 of the CAM array 60a. The performance of pipelined search operations in CAM arrays and a discussion of the bit line and match line power savings that may be achieved thereby are more fully described in U.S. Provisional Application Ser. No. 60/371,491, filed Apr. 10, 2002, entitled "Content Addressable Memory (CAM) Devices That Perform Power Saving Lookup Operations and Methods of Operating Same," and in the aforementioned U.S. application Ser. No. 10/323,236, filed Dec. 18, 2002, the disclosures of which are hereby incorporated herein by reference.

Figure 6B:
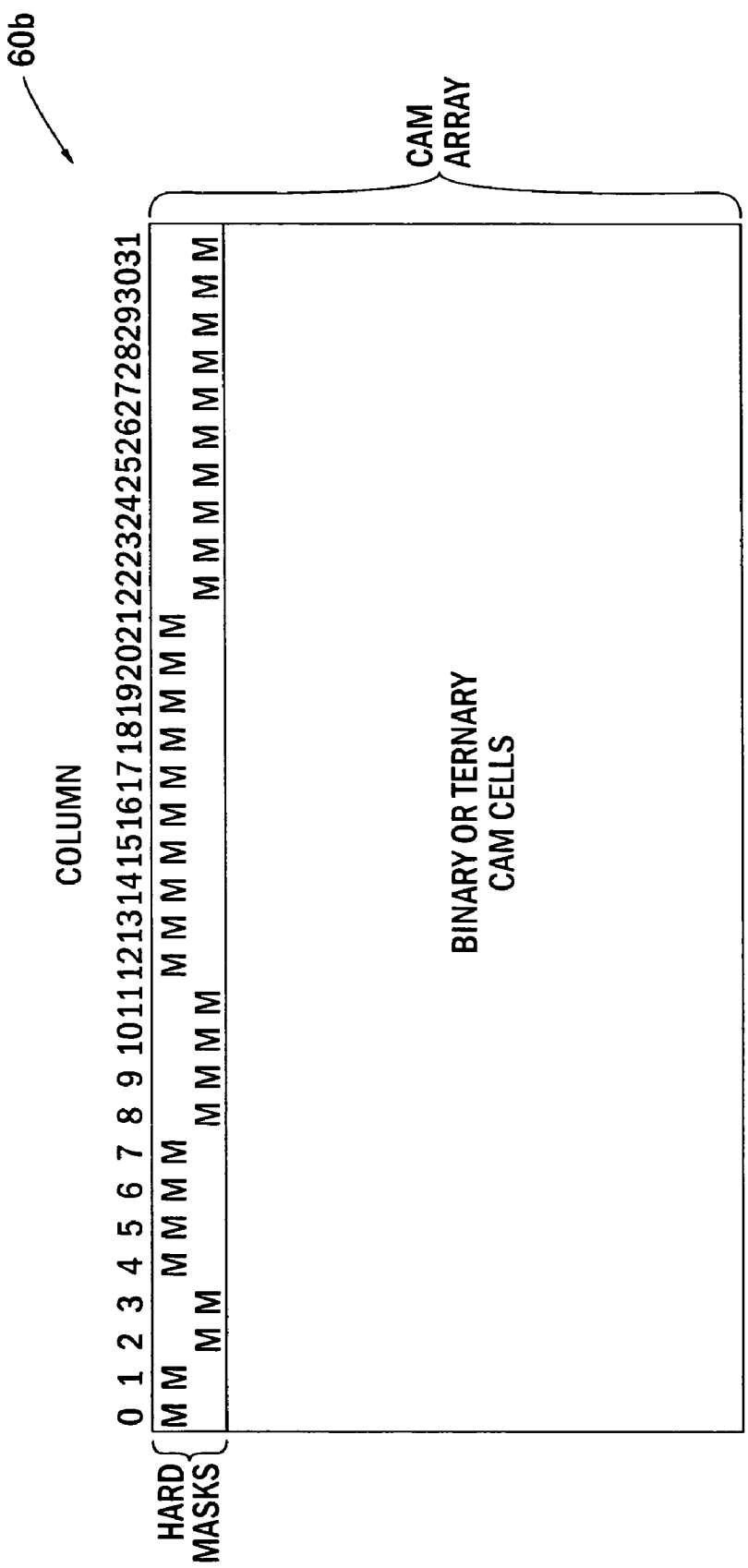
FIG. 6B is a block diagram of a CAM array according to an embodiment of the present invention.

Referring now to FIG. 6B, a CAM array 60b according to another embodiment of the present invention will be described. Like the CAM array 60a of FIG. 6A, the CAM array 60b of FIG. 6B includes a mask cell sub-array therein. The mask cell sub-array is illustrated as comprising two rows of hard mask cells. These rows of hard mask cells are segmented into contiguous groups so that power saving segmented "short" word search operations may be performed in CAM cell sub-arrays having relatively small binary CAM cells therein and/or relatively large CAM cells (e.g., ternary CAM cells) therein that each retain local mask information.

Figure 7:
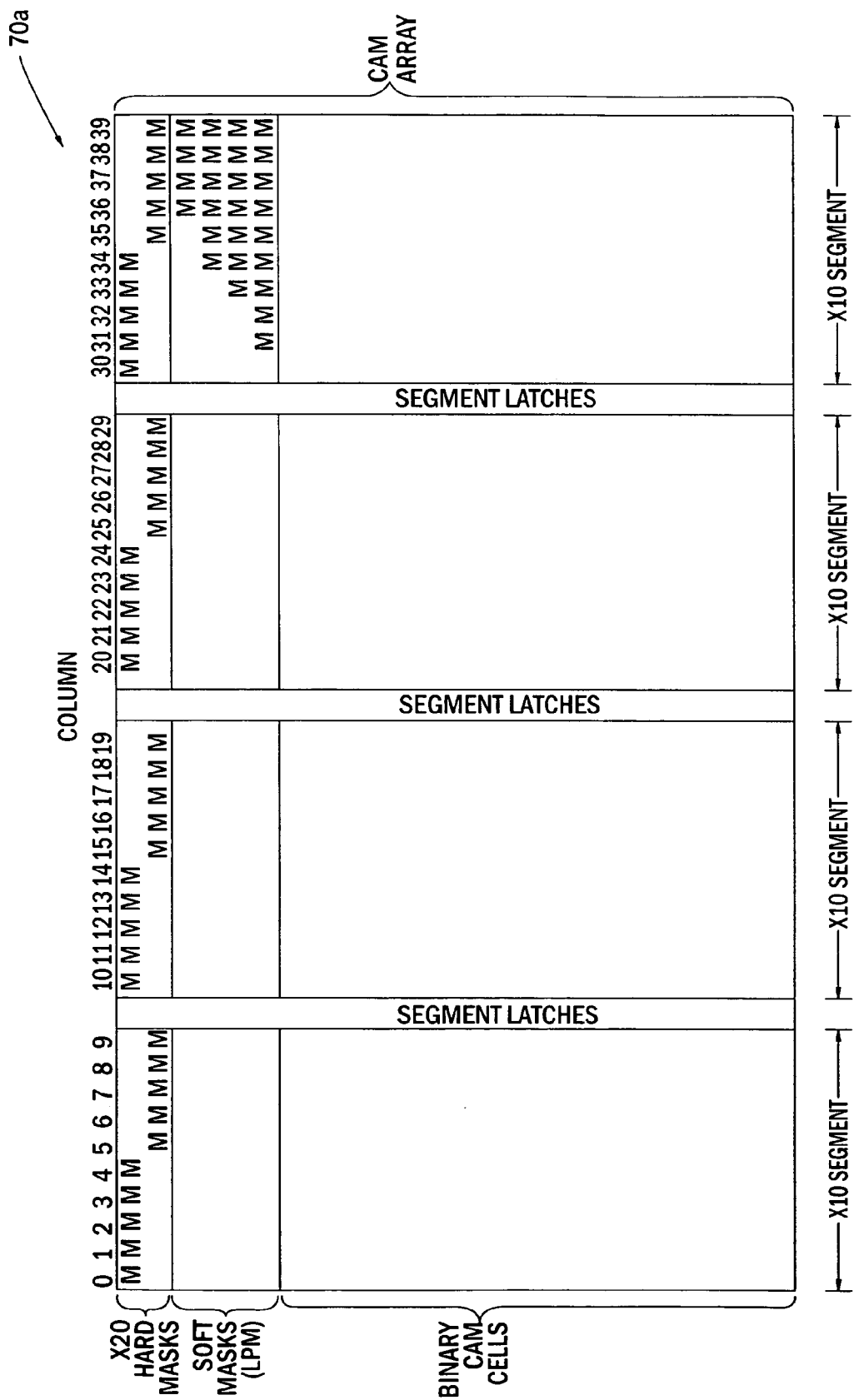
FIG. 7 is a block diagram of a CAM array that includes a CAM cell sub-array and mask cell sub-array therein and supports pipelined read, write, search and load mask operations, according to an embodiment of the present invention.

Referring now to FIG. 7, a CAM array 70a according to another embodiment of the present invention is illustrated. In particular, the CAM array 70a is illustrated as having a logical width of 40 bits, with each row of the CAM cell sub-array segmented into x10 partial rows that are separated by respective columns of match line latches. A x40 search operation may include performing a pipelined series of x10 partial word search operations on four segments of a x40 search word. For example, during a first search operation, a first x10 segment of a first search word (word D) may be applied to the bit lines associated with columns 0–9 of the CAM array 70a. At the completion of this first search operation, the states of the match lines associated with the first x10 segment of the CAM cell sub-array may be latched and provided as inputs to the second x10 segment of the CAM cell sub-array. Then, during a second search operation, a first x10 segment of a second search word (word C) and a second x10 segment of the first search word (word D) are applied to the bit lines associated with columns 0–9 and 10–19 of the CAM array 70a, respectively. At the completion of this second search operation, the states of the match lines associated with the first x10 segment and the second x10 segment may be latched and provided to the next higher segment by the corresponding match lines latches.

Next, during a third search operation, a first x10 segment of a third search word (word B), a second x10 segment of the second search word (word C) and a third x10 segment of the first search word (word D) are applied to the bit lines associated with columns 0–9, 10–19 and 20–29 of the CAM array 70a, respectively. At the completion of this third search operation, the states of the match lines associated with the first, second and third x10 segments are latched to prepare for the next following search operation. Finally, during a fourth search operation, a first x10 segment of a fourth search word (word A), a second x10 segment of the third search word (word B), a third x10 segment of the second search word (word C) and a fourth x10 segment of the first search word (word D) are applied to the bit lines associated with columns 0–9, 10–19, 20–29 and 30–39 of the CAM array 70a, respectively. At the completion of this fourth search operation, the states of the match lines associated with the first, second and third x10 segments are latched to prepare for the next following search operation and the states of the match lines associated with the fourth x10 segment may be passed in a conventional manner to a match line sense amplifier or directly to a row priority encoder, for example. Thus, in the illustrated embodiment, four pipelined search operations are required to completely compare a x40 search word to entries in the CAM array 70a. However, once the pipeline is full, each search operation will produce final match line signals that identify whether at least one match is present between a x40 search word and entries in the CAM array 70a. Similarly, if one of the x20 hard masks is used, each search operation will produce final match line signals that correspond to a respective x20 search word.

In a preferred power saving embodiment that is more fully described in the aforementioned U.S. application Ser. No. 10/323,236, the second x10 segment (or higher segments) of a x40 search word will not be applied to the bit lines associated with columns 10–19 unless at least one partial match has been identified at the outputs of the match lines associated with the first x10 segment of the CAM array 70a. Operations to precharge match and/or pseudo-ground lines that span columns 10–19 may also be disabled unless at least one match has been detected in the first x10 segment during the preceding search operation. Similarly, the third x10 segment of a x40 search word (or higher segments) will not be applied to the bit lines associated with columns 20–29 unless at least one partial match has been identified at the outputs of the match lines associated with the second x10 segment of the CAM array 70a. Likewise, the fourth x10 segment of a x40 search word will not be applied to the bit lines associated with columns 30–39 unless at least one partial match has been identified at the outputs of the match lines associated with the third x10 segment of the CAM array 70a.

Figure 8A:
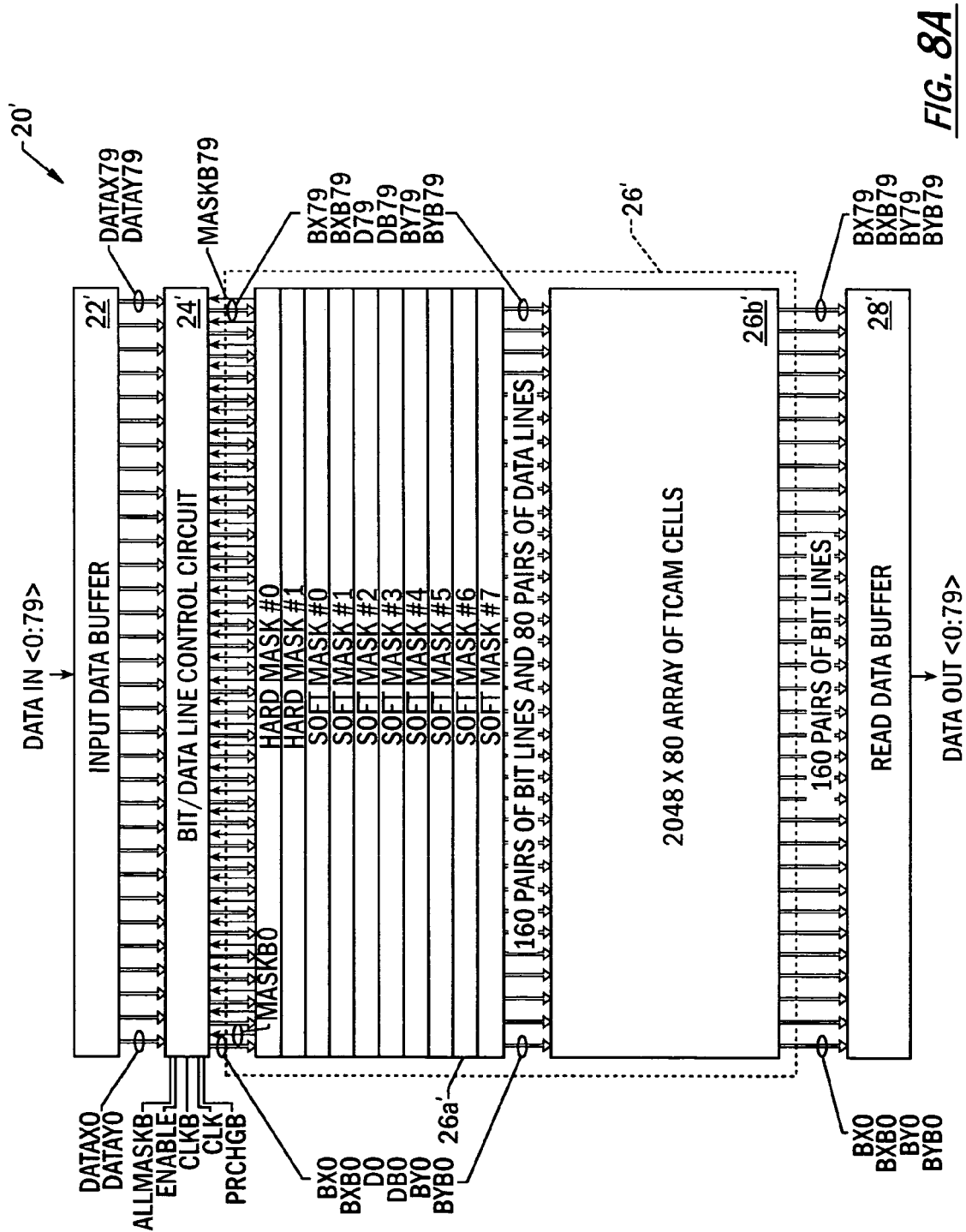
FIG. 8A is a block diagram of a ternary CAM device according to another embodiment of the present invention.

Referring now to FIG. 8A, a CAM device 20' according to another embodiment of the present invention will be described. This CAM device 20' includes an input data buffer 22' that receives data to be written as entries into rows within a CAM array 26' during write operations. The input data buffer 22' also receives search words that are applied as comparands during search operations. This data buffer 22' may include circuitry (e.g., splitter logic and shift registers) that facilitate pipelined search and pipelined write operations within the CAM array 26'. The input data buffer 22' is configured to pass data to a bit/data line control circuit 24'. This data may take the form of XY input data ((DATAX0, DATAY0)–(DATAX79, DATAY79)) that is compatible with ternary (or quaternay) CAM cells. As described more fully hereinbelow with respect to FIG. 10B, these CAM cells may include a pair of laterally spaced memory cells (e.g., SRAM cells) that collectively store two bits of data. In the case of ternary CAM cells, the two bits of data may have three valid combinations and one invalid combination. In the case of quaternary CAM cells, the two bits of data may have four valid combinations. Because two of these four valid combinations represent similar active mask conditions, quaternary CAM cells are frequently treated as another embodiment of ternary CAM cells.

In preferred embodiments, the CAM array 26' is configured to include a mask cell sub-array 26a' and a CAM cell sub-array 26b' therein. The CAM cell sub-array 26b' is illustrated as an array of ternary CAM (TCAM) cells having a logical width and depth of 80 columns and 2048 rows, respectively. Although not shown, additional redundant rows and columns of the CAM cell sub-array 26b' may also be provided as replacements for defective rows and columns. The mask cell sub-array 26a' is illustrated as having a capacity of eight (8) soft masks and two hard masks. As described more fully hereinbelow, the eight soft masks may be retained within four (4) rows of dedicated XY mask cells, with each row retaining an even mask word and an odd mask word. The two hard masks may be retained within a single row of XY hard mask cells (not shown), with each XY hard mask cell including two of the hard mask elements shown in FIG. 3B.

Figure 11A:
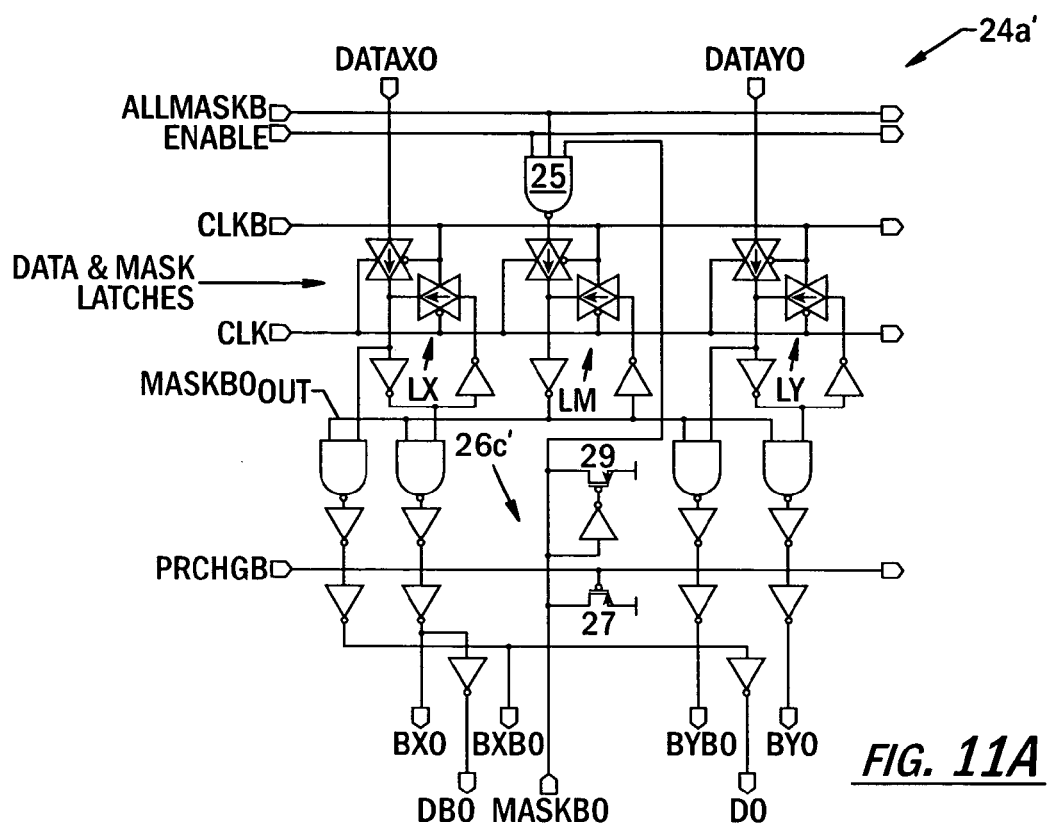
FIG. 11A is an electrical schematic of a bit/data line driver circuit according to an embodiment of the present invention.
Figure 11B:
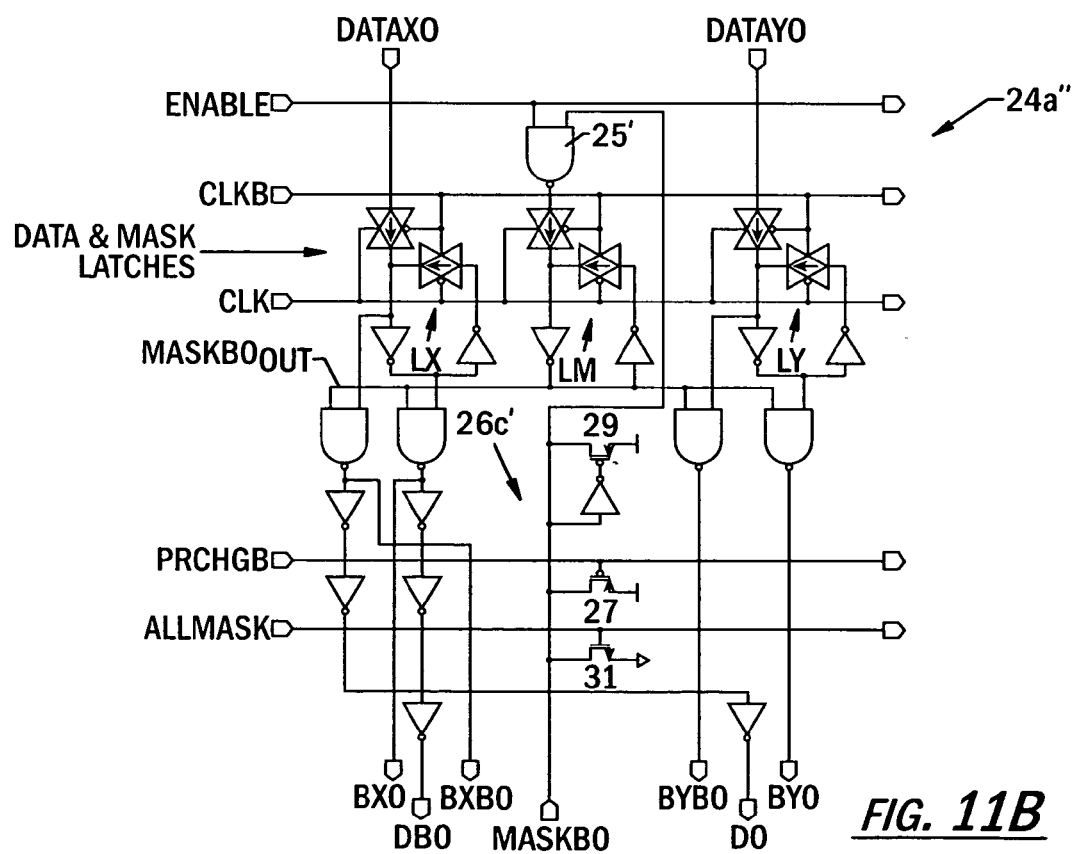
FIG. 11B is an electrical schematic of a bit/data line driver circuit according to another embodiment of the present invention.

The bit/data line control circuit 24' is electrically coupled to the CAM array 26' by a plurality of pairs of differential bit lines (shown as (BX0, BXB0, BY0, BYB0)–(BX79, BXB79, BY79, BYB79)), a plurality of pairs of differential data lines (shown as (D0,DB0)–(D79,DB79)) and a plurality of global mask signal lines (shown as MASKB0–MASKB79), which are illustrated as active low signal lines. In the illustrated embodiment, the plurality of pairs of differential bit lines are electrically connected to the mask cells within the mask cell sub-array 26a' and the CAM cells within the CAM cell sub-array 26b'. The plurality of pairs of differential data lines are electrically connected to the CAM cells within the CAM cell sub-array 26b', but are not electrically connected to the mask cells because the mask cells do not include compare circuitry. As explained more fully hereinbelow, the global mask signal lines (shown as MASKB0–MASKB79) are configured to pass global mask words from the mask cell sub-array 26a' to a bit/data line driver circuit within the bit/data line control circuit 24'. Exemplary bit/data line driver circuits are illustrated by FIGS. 9 and 11A–11B. In FIGS. 8A and 11A–11B, the control signal ALLMASKB is an active low signal that causes all pairs of the differential data lines (within a segment) to be pulled low during a search operation. The control signal ALLMASKB may be a signal that is pipelined and therefore latched by the segment latches illustrated in FIG. 8B. The control signal ENABLE is an active high signal that is used to enable the driver circuits. The signals CLK and CLKB represent clock signals that may be 180 degrees out of phase relative to each other in the event they have a 50% duty cycle. Alternatively, the signals CLK and CLKB may be represented by relatively short duration pulses having a less than 50% duty cycle. The control signal PRCHGB is an active low signal that is used to precharge the global mask signal lines (MASKB0–MASKB79).

A read data buffer 28' is provided to support read operations. The read data buffer 28' is electrically connected to the CAM cell sub-array 26b' by the illustrated pairs of differential bit lines. The two pairs of bit lines associated with each column of ternary CAM cells within the CAM cell sub-array 26b' (e.g., ((BXN, BXBN), (BYN, BYBN), where n is an integer) generate one of three possible data values during a read operation. These values are illustrated by TABLE 1:

TABLE 1

READ OPERATION (TERNARY)

| BXN | BYN | VALUE |
|---|---|---|
| 0 | 0 | MASKED |
| 0 | 1 | 0 |
| 1 | 0 | 1 |

In the event the CAM cells within the CAM cell sub-array 26b' are quaternary CAM cells, then the two pairs of bit lines associated with each column of the CAM cell sub-array 26b' generate one of four possible data values during a read operation. These values are illustrated by TABLE 2:

TABLE 2

READ OPERATION (QUATERNARY)

| | | |
|---|---|---|
| 0 | 0 | 0/Masked |
| 0 | 1 | 0/Unmasked |
| 1 | 0 | 1/Masked |
| 1 | 1 | 1/Unmasked |

Figure 10A:
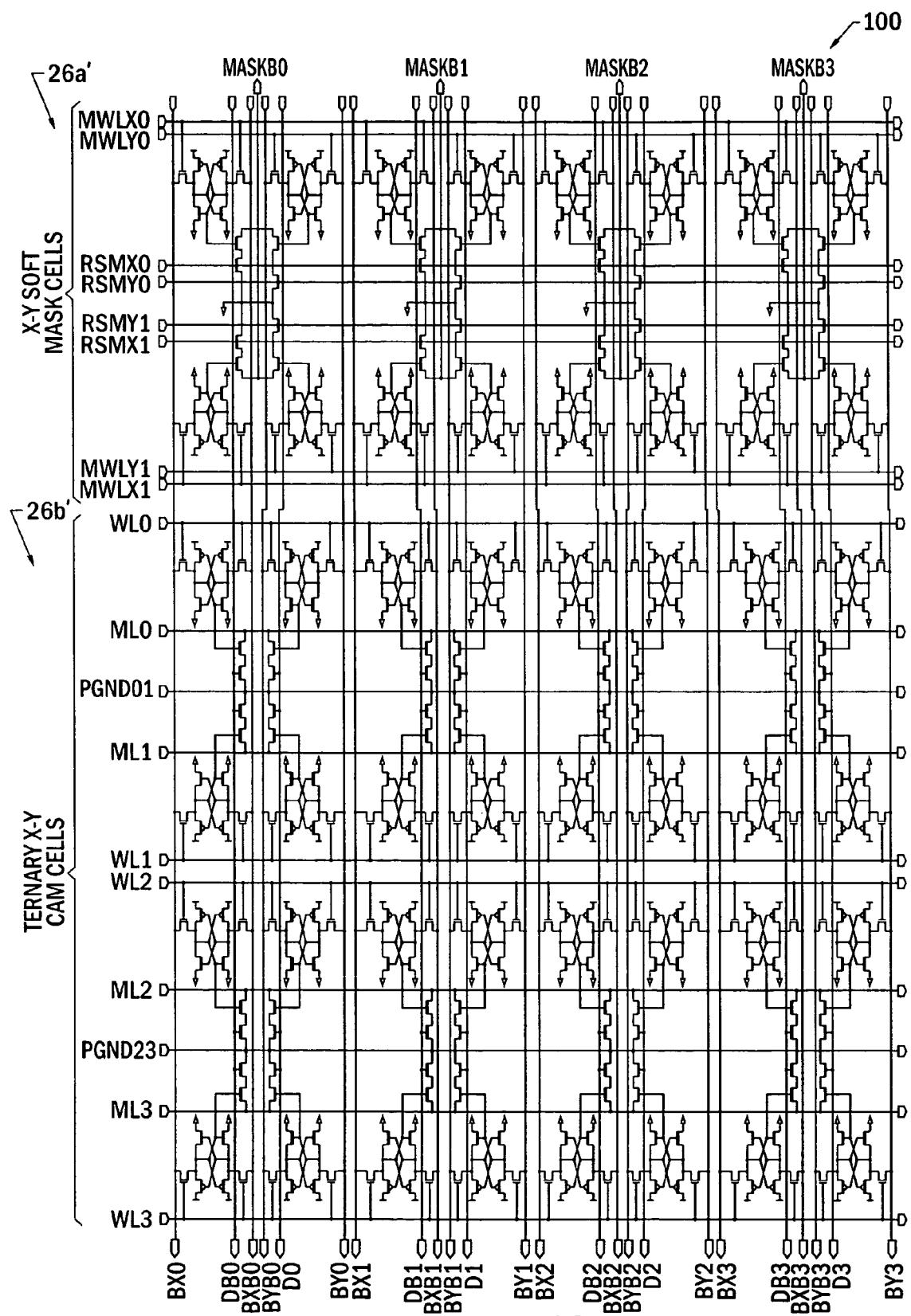
FIG. 10A is an electrical schematic that illustrates a portion of a mask cell sub-array and CAM cell sub-array according to an embodiment of the present invention.
Figure 10B:
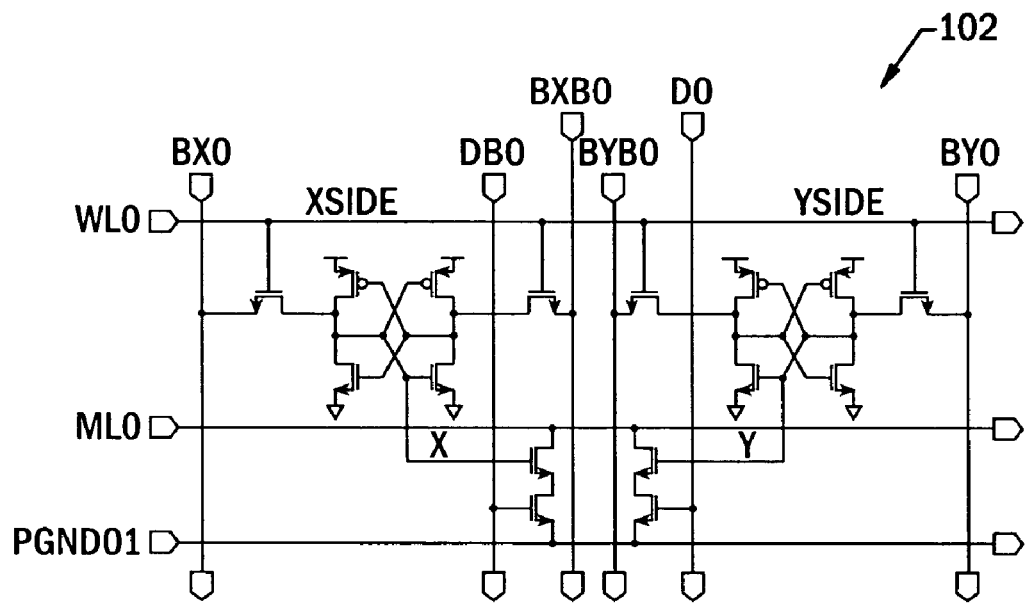
FIG. 10B is an electrical schematic of an XY CAM cell that is used in the CAM cell sub-array of FIG. 9 and FIG. 10A.

Referring now to FIG. 10B, a preferred ternary CAM cell 102, which may be used in the CAM cell sub-array 26b' of FIG. 8A, includes a pair of SRAM memory cells that share a common word line (shown as WL0). These two SRAM memory cells are illustrated as an XSIDE memory cell, which is electrically coupled to bit lines BX0 and BXB0, and a YSIDE memory cell, which is electrically coupled to bit lines BY0 and BYB0. The true output (X) of the XSIDE memory cell and the true output (Y) of the YSIDE memory cell are electrically connected to inputs of a four transistor (4T) compare circuit that extends between a match line (ML0) and a pseudo-ground line (PGND01). The 4T compare circuit also has two inputs that are electrically connected to a pair of differential data lines (shown as D0 and DB0). These aspects of the illustrated ternary CAM cell 102 are more fully described in the aforementioned '799 application. As illustrated by TABLE 3, the 4T compare circuit is configured to compare a bit of a comparand against the value of the data stored within the pair of memory cells during a search operation and reflect the result of that comparison on the match line. This comparison operation is performed in-sync with a high-to-low transition of the pseudo-ground line (PGND01). To conserve power, this high-to-low transition of the pseudo-ground line may be a transition from a maximum precharged voltage of (Vdd–Vth) to a minimum voltage of Vss, where Vdd is a power supply voltage to the CAM cell, Vss is a ground reference potential and Vth is a threshold voltage of an NMOS transistor.

TABLE 3

SEARCH OPERATION

| XSIDE | YSIDE | D0/DB0 | RESULT | MASK |
|---|---|---|---|---|
| 0 | 0 | X | MATCH (ML0 = 1) | ACTIVE |
| 0 | 1 | 0/1 | MATCH (ML0 = 1) | INACTIVE |
| 0 | 1 | 1/0 | MISS (ML0 = 0) | INACTIVE |
| 1 | 0 | 1/0 | MATCH (ML0 = 1) | INACTIVE |
| 1 | 0 | 0/1 | MISS (ML0 = 0) | INACTIVE |

Figure 10C:
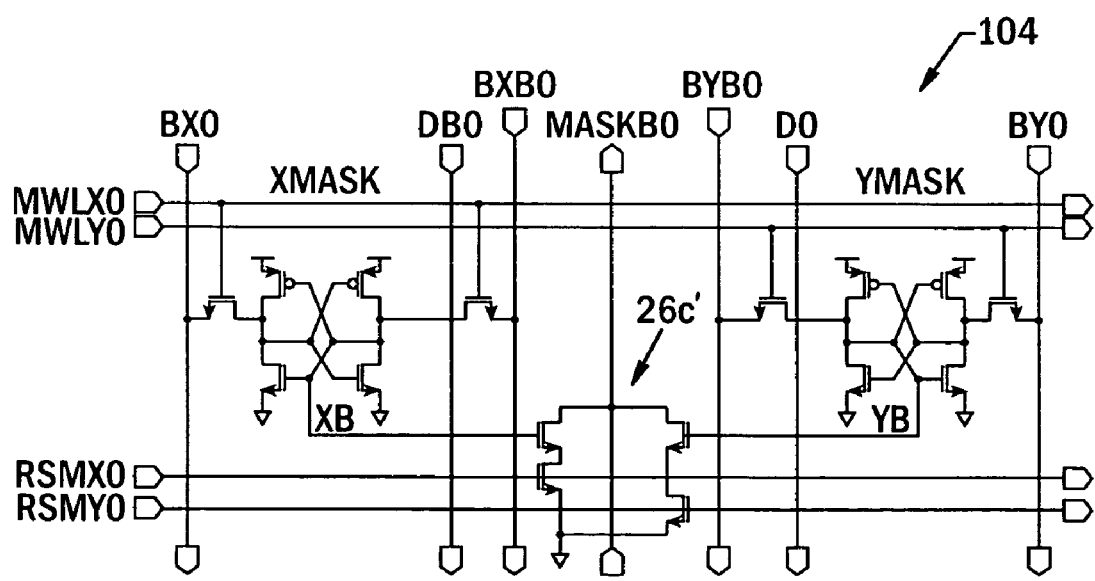
FIG. 10C is an electrical schematic of an XY mask cell that is used in the mask cell sub-array of FIG. 9 and FIG. 10A.

Referring now to FIG. 10C, an XY mask cell 104 according to a preferred aspect of the present invention will be described. The XY mask cell 104 of FIG. 10C includes two SRAM memory cells, shown as XMASK and YMASK. These two memory cells allow for the storage of two bits of mask data within each mask cell. Thus, each row of mask cells 104 may retain an "even" row mask word and an "odd" row mask word. The XY mask cell 104 also includes four transistors that operate as a portion of a mask assertion circuit 26c'. These four transistors and the XMASK and YMASK memory cells occupy the same layout footprint as the CAM cell 102 illustrated by FIG. 10B. The pair of access transistors within the XMASK memory cell have gate electrodes that are electrically connected to a respective mask word line MWLX0 and the pair of access transistors within the YMASK memory cell have gate electrodes that are electrically connected to a respective mask word line MWLY0. Accordingly, the XMASK memory cell and the YMASK memory cell can be written to (and read from) independently. For example, writing an active mask value into the XMASK memory cell includes driving the bit lines BX0 and BXB0 at a logic 0 and logic 1 levels, respectively, and strobing the mask word line MWLX0 with an active high pulse. Similarly, writing an active mask value into the YMASK memory cell includes driving the bit lines BY0 and BYB0 at a logic 0 and logic 1 levels, respectively, and strobing the mask word line MWLY0 with an active high pulse.

Each of the memory cells in the illustrated XY mask cell 104 generates a complementary output (shown as XB and YB). These complementary outputs are provided to the mask assertion circuit 26c'. The active or inactive state of the "even" mask bit within the XMASK memory cell may be read by switching an "even" read soft mask signal line RSMX0 low-to-high during a mask read operation. As explained more fully hereinbelow, when the signal line RSMX0 is switched low-to-high and the XMASK memory cell is storing an active mask value (i.e., XB=1), a previously precharged global mask signal line MASKB0 will be pulled high-to-low to indicate a global mask condition. However, if the XMASK memory cell is storing an inactive mask value (i.e., XB=0), then the global mask signal line MASKB0 will remain high at its precharged level, when signal line RSMX0 is switched low-to-high. Similarly, the active or inactive state of the "odd" mask bit within the YMASK memory cell may be read by switching an "odd" read soft mask signal line RSMY0 low-to-high during a mask read operation. When the signal line RSMY0 is switched low-to-high and the YMASK memory cell is storing an active mask value (i.e., YB=1), a previously precharged global mask signal line MASKB0 will be pulled high-to-low to indicate a global mask condition. However, if the YMASK memory cell is storing an inactive mask value (i.e., YB=0), then the global mask signal line MASKB0 will remain high at its precharged level when the read operation is performed.

Figure 8B:
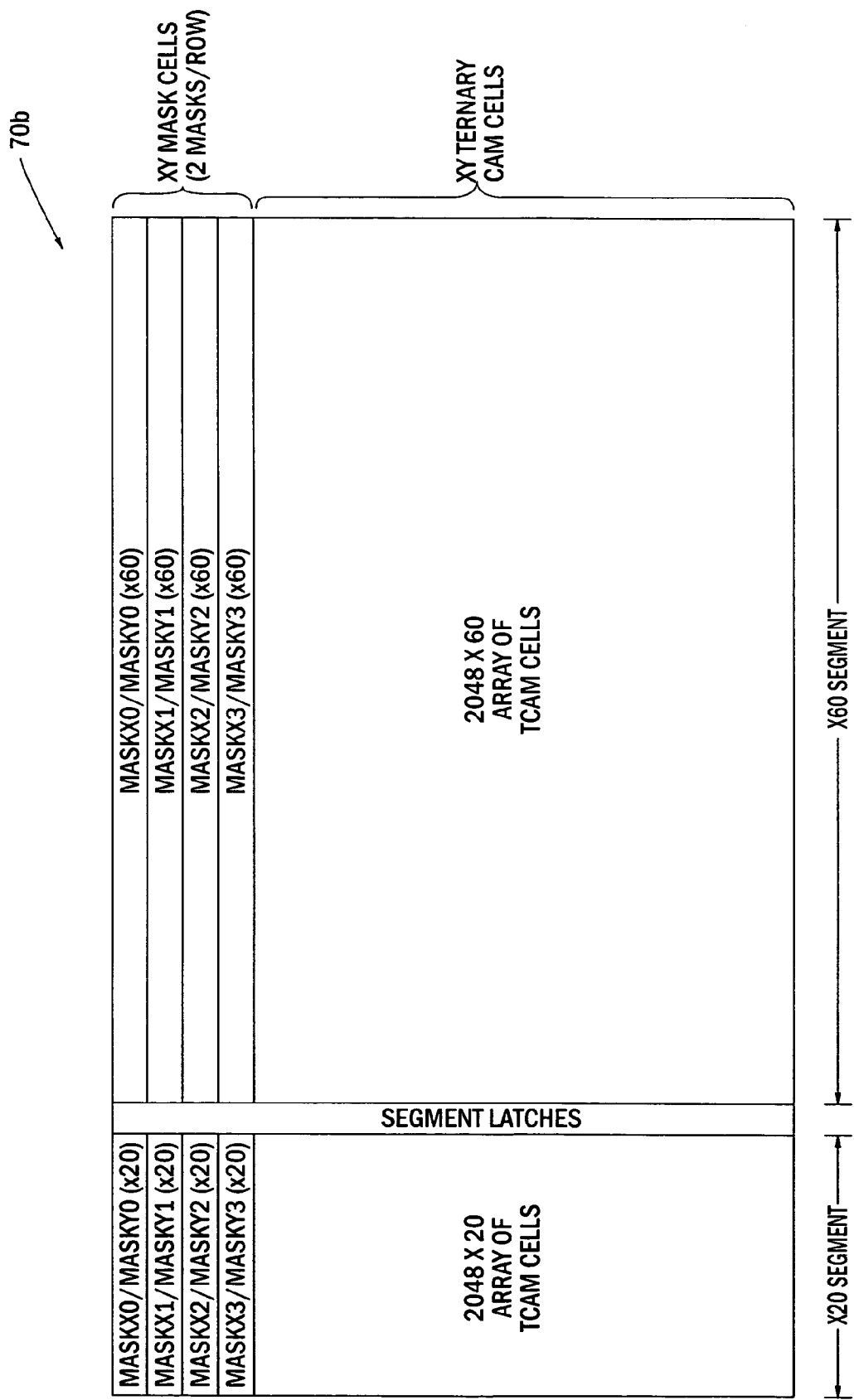
FIG. 8B is a block diagram of a CAM array that includes a segmented CAM cell sub-array and a segmented dedicated mask cell sub-array therein, according to an embodiment of the present invention.
Figure 9:
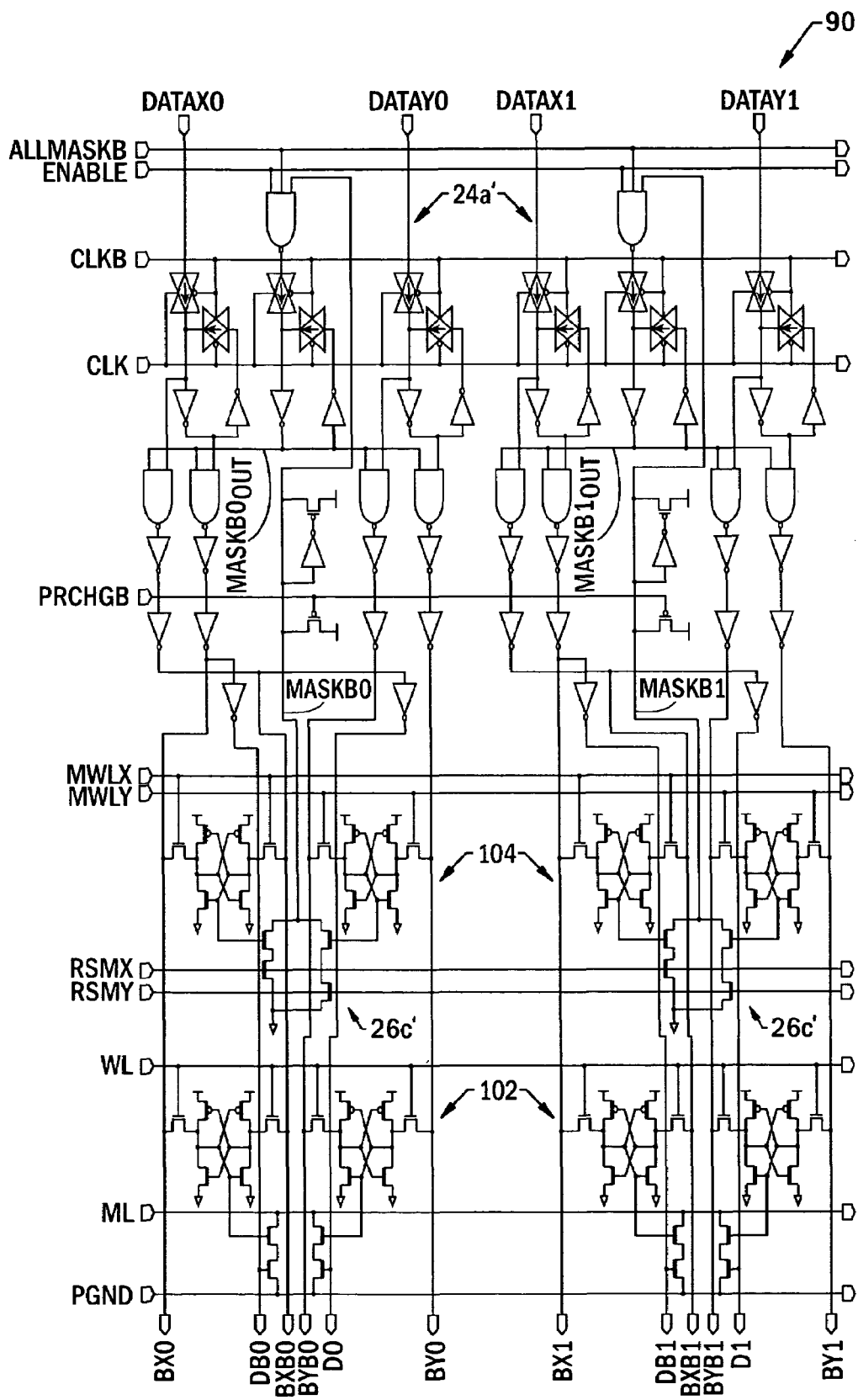
FIG. 9 is an electrical schematic that illustrates a bit/data line driver circuit, XY mask cells and XY ternary CAM cells according to an embodiment of the present invention.

A sub-array of XY ternary CAM cells and a sub-array of XY mask cells, such as those illustrated by FIGS. 10B and 10C, may be combined as illustrated by the CAM array 70b of FIG. 8B. This CAM array 70b is illustrated as including four rows of dedicated mask cells that retain eight (8) "soft" (i.e., programmable) mask words and 2048 rows of ternary CAM cells. The CAM array 70b has a logical width of 80 bits and is divided into two segments (shown as a lower x20 segment and an upper x60 segment). A vertical column of segment latches is provided. This column of latches divides the x20 and x60 segments from each other and facilitates pipelined operations with the CAM array 70b. As described more fully in the aforementioned '236 application, these segment latches are configured to latch "horizontal" word line and match line signals provided by the x20 segment of CAM cells during x20 write (and read) and x20 search operations. These segment latches are also configured to latch "horizontal" mask word line and read soft mask line signals provided by the x20 segment of dedicated XY mask cells. Other latches are also provided to latch the illustrated "horizontal" control signals (e.g., ALLMASKB).

The illustrated CAM array 26' of FIG. 8A and the CAM array 70b of FIG. 8B both receive bit and data line signals from a bit/data line driver circuit that is configured to support the use of dedicated XY mask cells and XY ternary CAM cells that share bit lines.

As illustrated by FIG. 11A, the bit/data line driver circuit 24a' is responsive to a plurality of control signals. These control signals include an all mask signal (ALLMASKB), which is an active low signal, and an enable signal (ENABLE), which is an active high signal. The bit/data line driver circuit 24a' is also connected to a respective column of the CAM array 26' by two pairs of bit lines (shown as (BX0, BXB0) and (BY0, BYB0)), a pair of data lines (D0, DB0) and a global mask signal line (MASKB0). The all mask signal ALLMASKB and the enable signal ENABLE are provided as inputs to a 3-input NAND gate 25. The 3-input NAND gate 25 is also configured to receive a global mask signal, shown as MASKB0, which is provided by the mask assertion circuit 26c'. The illustrated portion of the mask assertion circuit 26c' includes a PMOS pull-up transistor 27 that is responsive to an active low precharge signal (PRCHGB). When the precharge signal PRCHGB is switched high-to-low to prepare for a mask read operation, the global mask signal line MASKB0 is precharged high. A relatively weak PMOS pull-up transistor 29 and inverter are also provided to support each corresponding global mask signal line in its precharged state.

The bit/data line driver circuit 24a' includes three (3) data and mask latches, shown as LX, LM and LY. The latch LX latches an X data bit (DATAX0) in response to a pair of complementary clock signals CLK and CLKB. The latch LY latches a Y data bit (DATAY0) in response to the clock signals. The latch LM latches a signal at the output of the 3-input NAND gate 25 and generates an active low global mask output signal (shown as MASKB0$_{OUT}$). When the global mask output signal MASKB0$_{OUT}$ is latched low, all four bit lines BX0, BXB0, BY0 and BYB0 are set high and both data lines D0 and DB0 are set low to indicate a global mask condition during a corresponding search operation.

However, when all inputs to the 3-input NAND gate 25 are set high (which means the driver circuit 24a' is enabled and no global masking is present), then the bit lines and data lines at the outputs of the driver circuit 24a' will be driven with the differential data signals illustrated by TABLE 4.

FIG. 11A illustrates an alternative bit/data line driver circuit 24a'' that is similar to the driver circuit 24a' illustrated by FIG. 11B. However, the 3-input NAND gate 25 illustrated in FIG. 11A is replaced by a 2-input NAND gate 25'. In addition, an all mask signal (ALLMASK) is treated as an active high signal that drives the gate of an NMOS pull-down transistor 31. The drain terminal of this NMOS pull-down transistor 31 is electrically connected to the global mask signal line MASKB0. Thus, when active, the all mask signal ALLMASK operates to pull-down all the global mask signal lines MASKBn (where n is an integer) associated with a respective segment of a CAM array. The data signals illustrated by TABLE 4 apply to the driver circuit 24a'' of FIG. 11B.

In the CAM circuit 90 of FIG. 9, the bit/data line driver circuit of FIG. 11A is combined with the CAM cells 102 and dedicated mask cells 104 illustrated by FIGS. 10B–10C, to form a portion of a CAM device according to an embodiment of the present invention. In particular, FIG. 9 illustrates two "cells" of a bit/data line driver circuit that are connected to a 1×2 sub-array of mask cells 104 and a 1×2 sub-array of CAM cells 102. The CAM circuit 100 of FIG. 10A illustrates a 2×4 sub-array of dedicated XY mask cells 26a' in combination with a 4×4 sub-array of ternary CAM cells 26b'. The sub-array of CAM cells 26b' also utilizes shared pseudo-ground lines (shown as PGND01 and PGND23).

The global mask signals MASB0–MASKB3, which originate from the mask cell sub-array 26a' of FIG. 10A, are provided as inputs to a bit/data line driver circuit (see, e.g., FIG. 9 and FIGS. 11A–11B). Along with the data input signals (see, e.g., (DATAX0, DATAY0)–(DATAX79, DATAY79)), these global mask signals are latched into the driver circuit so that global masking operations may be performed during a corresponding search operation. As illustrated by TABLE 5, the CAM array 70b of FIG. 8B may undergo a plurality of consecutive pipelined search operations, which include loading respective x20 and x60 segments of search words (SW) and mask words (MW) into latches (see, e.g., latches LX, LM and LY in FIGS. 11A–11B) within the bit/data line driver circuit. The search words are illustrated as words Z, A, B, C, D, E and F. In TABLE 5, the x20 search operations and x60 search operations are illustrated as being offset in time by 0.5T, where T is a period of a clock signal (e.g., T=2 ns). This timing of the pipelined search operations is more fully illustrated and described in the aforementioned '236 application.

TABLE 5

| CAM Operations Foreground | | | |
|---|---|---|---|
| 2T(−) | Load A20 SW & A20 MW | 1.5T(−) | Load Z60 SW & Z60 MW |
| 4T(−) | Load B20 SW & B20 MW | 3.5T(−) | Load A60 SW & A60 MW |

TABLE 4

| INPUT DATA | | DRIVER CIRCUIT OUTPUTS | | | | | | OPERATION | |
|---|---|---|---|---|---|---|---|---|---|
| DATAX0 | DATAY0 | D0 | DB0 | BX0 | BXB0 | BY0 | BYB0 | WRITE | SEARCH |
| 0 | 0 | 0 | 1 | 0 | 1 | 0 | 1 | MASK | — |
| 0 | 1 | 0 | 1 | 0 | 1 | 1 | 0 | 0 | 0 |
| 1 | 0 | 1 | 0 | 1 | 0 | 0 | 1 | 1 | 1 |

TABLE 5-continued

CAM Operations
Foreground

| | | | | |
|---|---|---|---|---|
| 6T(–) | Load C20 SW & C20 MW | 5.5T(–) | Load B60 SW & B60 MW | |
| 8T(–) | Load D20 SW & D20 MW | 7.5T(–) | Load C60 SW & C60 MW | |
| 10T(–) | Load E20 SW & E20 MW | 9.5T(–) | Load D60 SW & D60 MW | |
| 12T(–) | Load F20 SW & F20 MW | 11.5T(–) | Load E60 SW & E60 MW | |

In TABLE 6, the foreground operations illustrated by TABLE 5 are combined with background operations. These background operations illustrate the timing of operations to read the x20 and x60 masks (MASK), which are held within a dedicated mask cell sub-array, into the mask assertion circuits associated with each column of a CAM array. TABLE 6 also illustrates how pipeline bubbles (in foreground) can be eliminated by tightly interleaving segmented search operations with segmented read and write operations (including operations to write mask words into the mask cell sub-array). These interleaving operations are also described more fully in the aforementioned '236 application.

tions, which are a particular form of "best match" (BM) search operations, may be performed in each of a plurality of full or partially full CAM array blocks having one or more columns of exclusively locally masked CAM cells for all valid entries therein. For such cases when local masking is present for all valid entries within an active column(s) (i.e., a column within a search path of the CAM array block and not an unused redundant column), it may not be necessary to repeatedly drive a pair of differential data lines (D and DB) with the corresponding bits from consecutively applied search words. Instead, it may be preferable to hold a pair of differential data lines in a global mask condition (e.g., D=DB=0) until at least one valid entry is added to the CAM array block with an unmasked bit in the position of the active column being globally masked. This global masking technique may result in substantial power savings for each of a plurality of CAM array blocks having entries therein with relatively large numbers of locally masked bits in overlapping bit positions, which is frequently the case in devices supporting LPM search operations or other types of best match search operations in CAM array blocks having ternary or quaternary CAM cells (hereinafter collectively referred to as "ternary CAM cells").

TABLE 6

CAM Operations

| Foreground | | | | Background | | | |
|---|---|---|---|---|---|---|---|
| 2T(4ns) | Search_A20 | 1.5T | Search_Z60 | 2T | Read B20 Mask | 1.5T | Read A60 Mask |
| 4T | Search_B20 | 3.5T | Search_A60 | 4T | Read C20 Mask | 3.5T | Read B60 Mask |
| 6T | Search_C20 | 5.5T | Search_B60 | 6T | Read D20 Mask | 5.5T | Read C60 Mask |
| 8T | Search_D20 | 7.5T | Search_C60 | 8T | Read E20 Mask | 7.5T | Read D60 Mask |
| 10T | Search_E20 | 9.5T | Search_D60 | 10T | Read F20 Mask | 9.5T | Read E60 Mask |
| 12T | Search_F20 | 11.5T | Search_E60 | 12T | Read G20 Mask | 11.5T | Read F60 Mask |
| 14T | Search_G20 | 13.5T | Search_F60 | 14T | Read H20 Mask | 13.5T | Read G60 Mask |
| 16T | Search_H20 | 15.5T | Search_G60 | 16T | No-Op | 15.5T | Read H60 Mask |
| 18T | Write_I20 | 17.5T | Search_H60 | 18T | Read J20 Mask | 17.5T | No-Op |
| 22T | Search_J20 | 19.5T | Write_I60 | 22T | Read K20 Mask | 19.5T | Read J60 Mask |
| 24T | Search_K20 | 23.5T | Search_J60 | 24T | Read L20 Mask | 23.5T | Read K60 Mask |
| 26T | Search_L20 | 25.5T | Search_K60 | 26T | No-Op | 25.5T | Read L60 Mask |
| 28T | Read_M20 | 27.5T | Search_L60 | 28T | Read N20 Mask | 27.5T | No-Op |
| 32T | Search_N20 | 29.5T | Read_M60 | 32T | No-Op | 29.5T | Read N60 Mask |
| 34T | Write_O20 | 33.5T | Search_N60 | 34T | No-Op | 33.5T | No-Op |
| 38T | Read_P20 | 35.5T | Write_O60 | 38T | Read Q20 Mask | 35.5T | No-Op |
| 42T | Search_Q20 | 39.5T | Read_P60 | 42T | Read R20 Mask | 39.5T | Read Q60 Mask |
| 44T | Search_R20 | 43.5T | Search_Q60 | 44T | Read S20 Mask | 43.5T | Read R60 Mask |
| 46T | Search_S20 | 45.5T | Search_R60 | 46T | Read T20 Mask | 45.5T | Read S60 Mask |
| 48T | Search_T20 | 47.5T | Search_S60 | 48T | No-Op | 47.5T | Read T60 Mask |
| 50T | Write_Mask1_20 | 49.5T | Search_T60 | 50T | No-Op | 49.5T | No-Op |
| 54T | Write_Mask2_20 | 51.5T | Write_Mask1_60 | 54T | Read U20 Mask | 51.5T | No-Op |
| 58T | Search_U20 | 55.5T | Write_Mask2_60 | 58T | Read V20 Mask | 55.5T | Read U60 Mask |
| 60T | Search_V20 | 59.5T | Search_U60 | 60T | Read W20 Mask | 59.5T | Read V60 Mask |
| 62T | Search_W20 | 61.5T | Search_V60 | 62T | Read X20 Mask | 61.5T | Read W60 Mask |

The above-described global masking operations may also be used to achieve substantial power savings when ternary CAM devices are used to perform longest prefix match (LPM) search operations in such applications as Classless Inter-Domain Routing (CIDR). Such LPM search opera- Thus, if a CAM array block has the following 128 valid entries sorted by prefix length as shown in TABLE 7, where M represents a locally masked CAM cell, then columns 75–79 may be globally masked during consecutive search operations:

TABLE 7

TCAM COLUMNS 0–79

| ROW | 0 | 1 | 2 | 3 | 4 | 5 | 6 | 7 | 8 | 9 | 10 | 11 | 12 | ... | 71 | 72 | 73 | 74 | 75 | 76 | 77 | 78 | 79 |
|---|---|---|---|---|---|---|---|---|---|---|---|---|---|---|---|---|---|---|---|---|---|---|---|
| 1 | 0 | 1 | 0 | 1 | 0 | 1 | 0 | 0 | 0 | 1 | 0 | 1 | 0 | ... | 1 | 0 | 0 | 0 | M | M | M | M | M |
| 2 | 1 | 1 | 1 | 1 | 1 | 0 | 0 | 1 | 0 | 1 | 0 | 1 | 1 | ... | 0 | 1 | 0 | 0 | M | M | M | M | M |

TABLE 7-continued

| | TCAM COLUMNS 0–79 | | | | | | | | | | | | | | | | | | | | |
|---|---|---|---|---|---|---|---|---|---|---|---|---|---|---|---|---|---|---|---|---|---|
| ROW | 0 | 1 | 2 | 3 | 4 | 5 | 6 | 7 | 8 | 9 | 10 | 11 | 12 | ... | 71 | 72 | 73 | 74 | 75 | 76 | 77 | 78 | 79 |
| 3 | 1 | 1 | 0 | 1 | 0 | 1 | 0 | 0 | 0 | 1 | 0 | 1 | 1 | ... | 1 | 1 | 0 | 0 | M | M | M | M | M |
| 4 | 1 | 1 | 1 | 1 | 1 | 0 | 0 | 1 | 0 | 1 | 0 | 1 | 0 | ... | 1 | 0 | 0 | 0 | M | M | M | M | M |
| 5 | 0 | 1 | 0 | 1 | 1 | 1 | 0 | 0 | 0 | 1 | 0 | 1 | 0 | ... | 0 | 1 | 0 | M | M | M | M | M | M |
| 6 | 1 | 0 | 1 | 1 | 0 | 0 | 0 | 1 | 0 | 1 | 0 | 1 | 1 | ... | 1 | 0 | 0 | M | M | M | M | M | M |
| 7 | 1 | 1 | 0 | 1 | 1 | 1 | 0 | 0 | 0 | 1 | 0 | 1 | 1 | ... | 0 | 1 | 0 | M | M | M | M | M | M |
| 8 | 1 | 1 | 1 | 1 | 0 | 0 | 0 | 1 | 0 | 1 | 0 | 1 | 0 | ... | 1 | 1 | 0 | M | M | M | M | M | M |
| 9 | 1 | 1 | 0 | 1 | 1 | 1 | 0 | 0 | 0 | 1 | 1 | 1 | 0 | ... | 1 | 0 | 0 | M | M | M | M | M | M |
| 10 | 0 | 1 | 1 | 1 | 1 | 0 | 0 | 1 | 0 | 1 | 0 | 1 | 1 | ... | 0 | 1 | 0 | M | M | M | M | M | M |
| | | | | | | | | | | | * * * | | | | | | | | | | | |
| 125 | 0 | 1 | 0 | 0 | 1 | 1 | 0 | 1 | 0 | 1 | 1 | 1 | 0 | ... | 1 | M | M | M | M | M | M | M | M |
| 126 | 1 | 1 | 0 | 1 | 0 | 0 | 0 | 0 | 1 | 1 | 0 | 1 | 0 | ... | 1 | M | M | M | M | M | M | M | M |
| 127 | 0 | 0 | 0 | 1 | 1 | 1 | 0 | 1 | 0 | 1 | 1 | 1 | 1 | ... | 1 | M | M | M | M | M | M | M | M |

In addition to global masking, alternative embodiments may include floating a pair of differential data lines associated with a column having exclusively locally masked CAM cells for all valid entries. In still further embodiments, the pair of differential data lines may be held at a fixed data value (0 or 1) to prevent switching of the pair of differential data lines during search operations. Thus, in the example of TABLE 7, the pairs of differential data lines associated with columns 75–79 may be floated or frozen at data value (0 or 1), which may be different for various ones of the pairs, during consecutive search operations.

Figure 12:
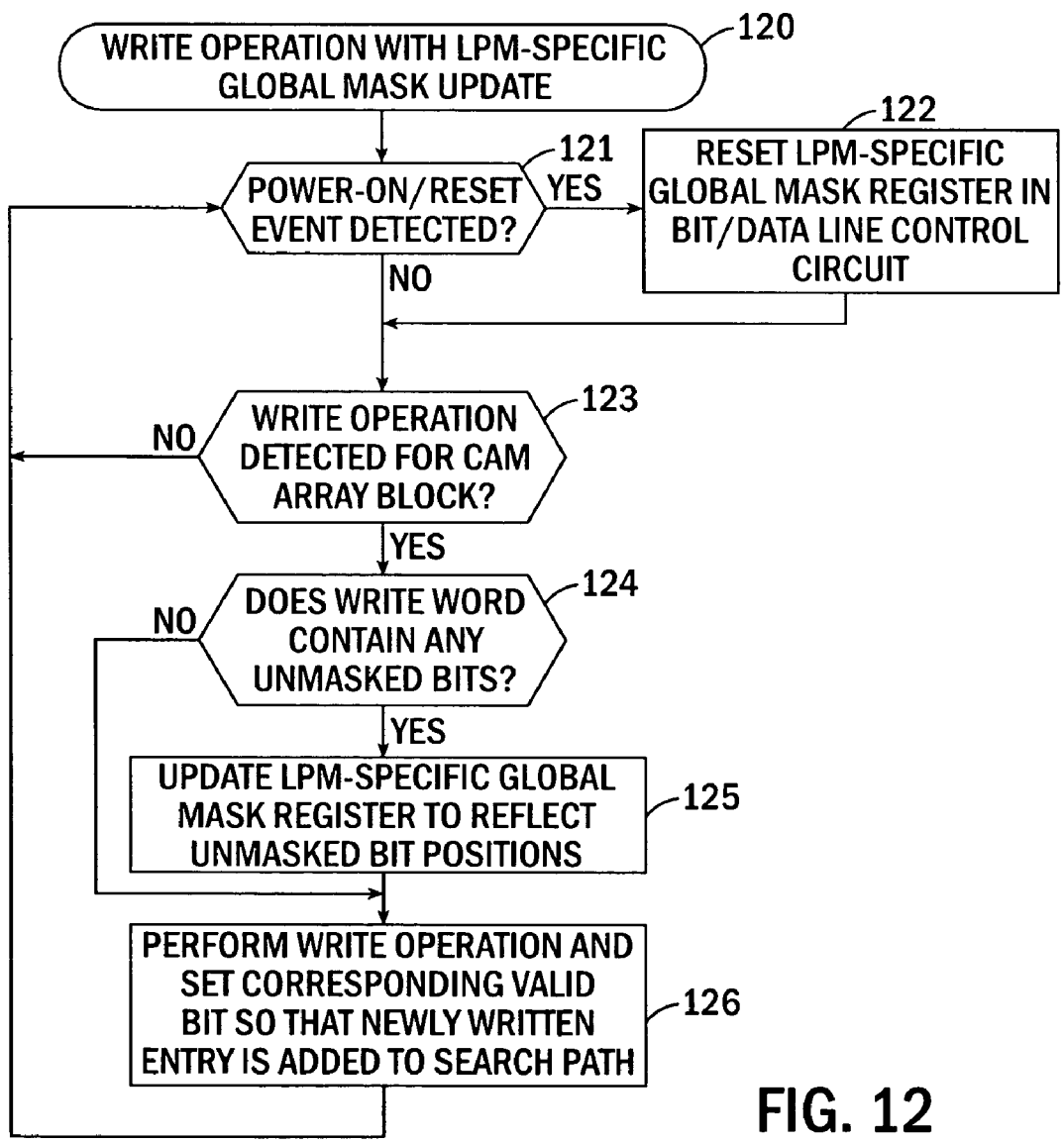
FIG. 12 is a flow diagram that illustrates operations to update an LPM-specific global mask register within a bit/data line driver circuit.
Figure 13A:
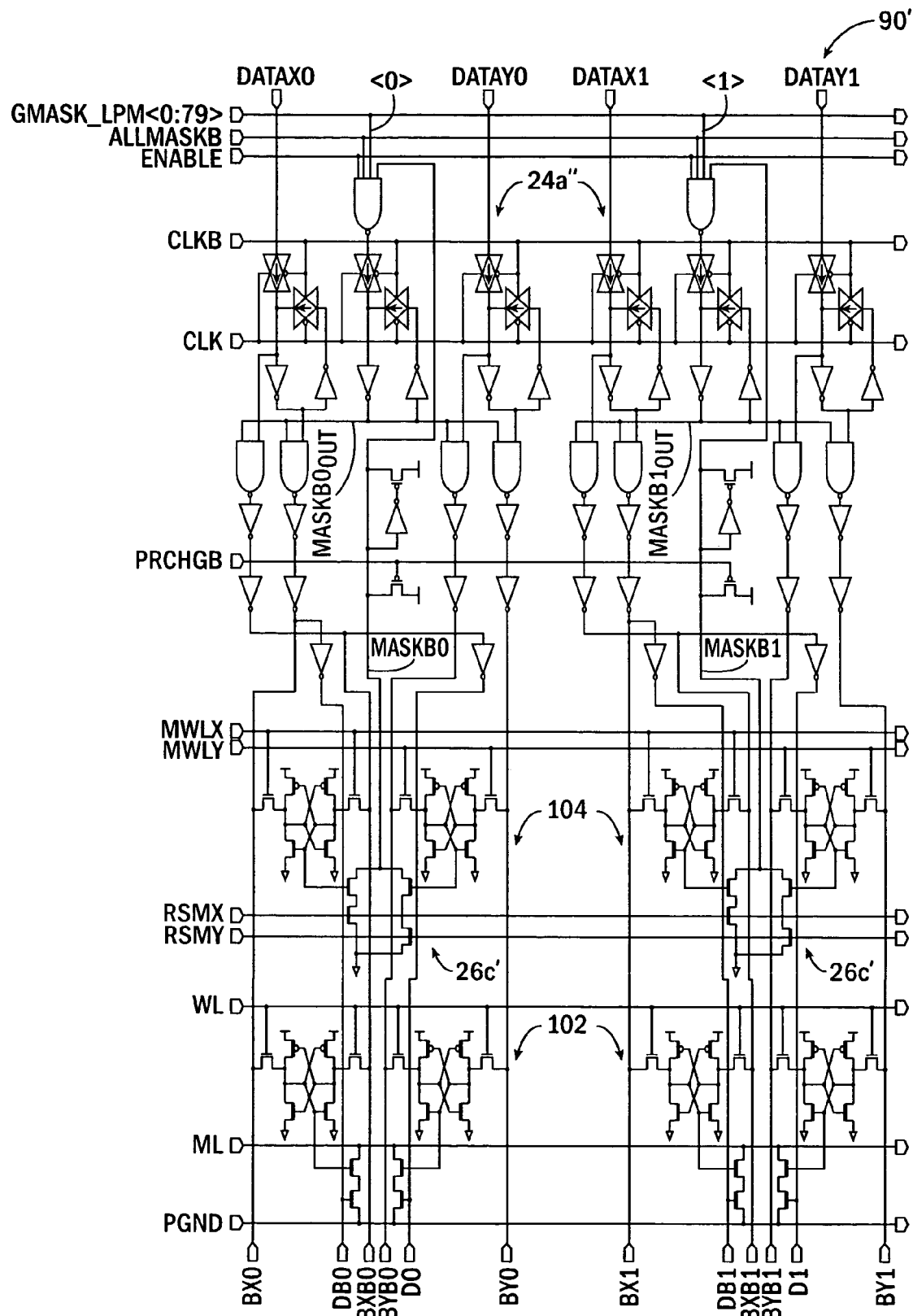
FIG. 13A is an electrical schematic that illustrates a bit/data line driver circuit, XY global mask cells and XY ternary CAM cells according to additional embodiments of the present invention.
Figure 13B:
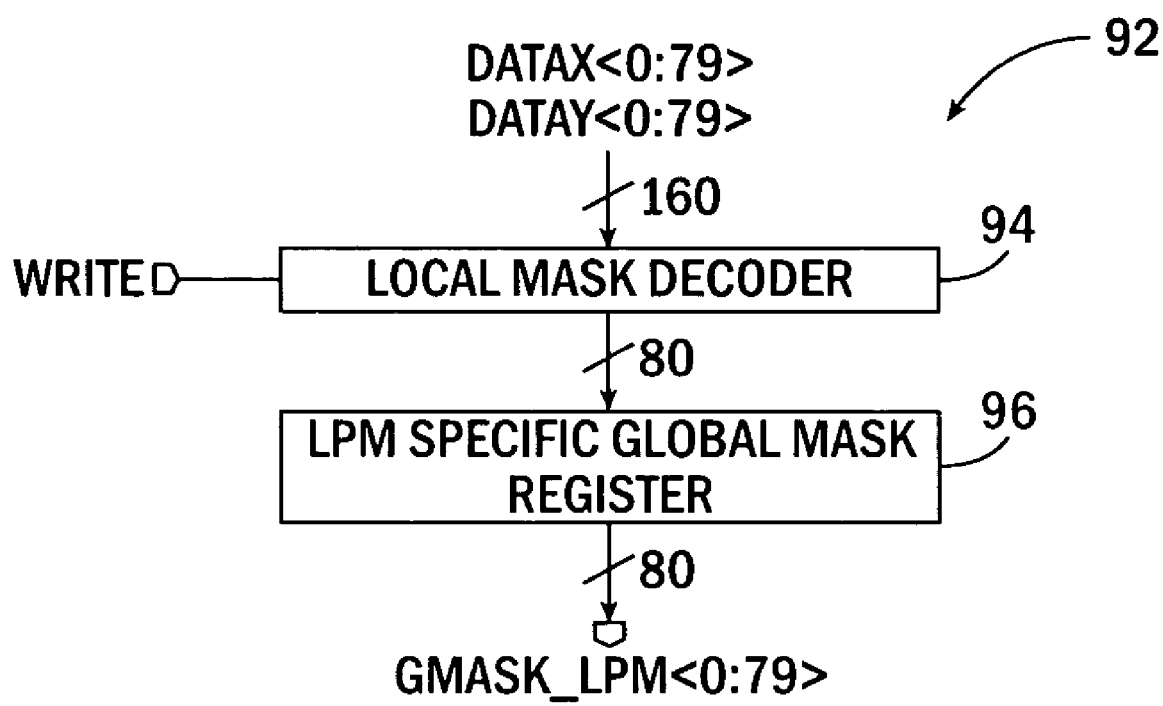
FIG. 13B is a block diagram of a LPM-specific global mask generator and register, according to additional embodiments of the present invention.

As illustrated by the flow diagram of FIG. 12 and the CAM circuit 90' of FIGS. 13A–13B, which is similar to the CAM circuit 90 of FIG. 9, this power-saving global masking technique may include updating an LPM-specific global mask register 96 within a bit/data line driver circuit 24a" during operations to write entries into a corresponding CAM array block. The CAM circuit 90' represents a two-bit "vertical slice" of a full circuit having 80 equivalent columns. For purposes of discussion, the illustrated portion of the CAM circuit 90' will be treated herein as having all 80 columns. Moreover, other portions of the CAM circuit 90' that are described above with respect to FIG. 9 apply equally to the same portions illustrated in FIG. 13A.

In FIG. 12, a write operation 120 is shown as including an LPM-specific global mask update operation. Upon detection of a power-up or reset event within a CAM device, Block 121, all entries within each of a plurality of CAM array blocks may be set as invalid entries that are thereby outside a search path of the CAM device. The LPM-specific global mask register 96 associated with each CAM array block may also be reset to a default condition, Block 122. This default condition may cause all columns of the corresponding CAM array block to be globally masked (i.e., D=DB=0 during search operations) until at least one valid entry is written into the CAM array block. This global masking operation across all columns will occur by resetting the global mask GMASK_LPM<0:79> associated with all CAM array blocks to: <0000 . . . 000> (i.e., the default condition). This resetting of GMASK_LPM will cause all MASKBn$_{OUT}$ signals (see FIG. 13A), where "n" is a non-negative integer, to be switched or held low in response to a power-up/reset event.

Thereafter, the detection of an operation to write an entry into a CAM array block, Block 123, results in a check to determine whether the incoming write word contains any unmasked bits (i.e., whether any bits represent a "1" or "0" and not a locally masked condition M), Block 124. In a typical case, each incoming write word to be added to a CAM array block will contain many unmasked bits and possibly one or more locally masked bits that overlap with the locally masked bits of previously written entries. This check of unmasked bit positions results in an update of the LPM-specific global mask register 96. This update is performed so that the LPM-specific global mask (GMASK_LPM<0:79>) will reflect any new unmasked bit positions added by the incoming write word in addition to all unmasked bit positions associated with previously written entries that were added to the CAM array block after a most recent power-up/reset event, Block 125. In alternative embodiments, this update of the LPM-specific global mask register 96 may be replaced by an update of an LPM-specific row of soft mask cells within the mask cell sub-array 26a'. Other aspects of the mask cell sub-array 26a' are described hereinabove with respect to FIGS. 8–11. In still further embodiments of the invention, the LPM-specific global mask register 96 may be a more general "best match" global mask register. In such cases, the locally masked bits within a CAM array block may have a more random arrangement from row-to-row.

Consistent with the detection of a write operation, the incoming write word is written as an entry into an addressed row of the CAM array block, Block 126. This write operation may include setting (e.g., writing) a valid bit in the same row received the new word to thereby add the row to the search path of the CAM array block. As will be understood by those skilled in the art, the value of the valid bit for an entry may control whether the match line for the corresponding row undergoes a precharge operation in advance of each search operation.

As illustrated by FIG. 13B, an LPM-specific global mask generator 92, which may be located within each bit/data line driver circuit 24a", includes a local mask decoder 94, which is responsive to a write command signal WRITE, and the LPM-specific global mask register 96. The local mask decoder 94 evaluates each incoming write word (DATAX<0:79> and DATAY<0:79>) for the presence of masked and unmasked bits and generates a multi-bit output (e.g., 80-bit output) that identifies the position of every unmasked bit in the incoming write word. As illustrated by the CAM circuit 90' of FIG. 13A, an LPM-specific global mask bit having a logic 0 value will cause the corresponding portion of the bit/data line driver circuit 24a" to generate a global mask condition on the corresponding pair of differential data lines (D and DB) and sustain this condition during consecutive search operations. Thus, for the example illustrated above by TABLE 7, the LPM-specific global mask GMASK_LPM<0:79> would have a value equal to <11111 . . . 11100000> after all 128 entries were added to the CAM array block. Under these conditions, the signals $MASKB75_{OUT}$–$MASKB79_{OUT}$ would be held at logic 0 values and the data lines D/DB<75:79> at the outputs of the bit/data line driver circuit 24a" would be held in a global mask condition (e.g., D=DB=0) during subsequent search operations. In this manner, the bit/data line driver circuit 24a" is configured to apply an LPM-specific global mask (or best match (BM) specific global mask) to incoming search words so that each of the plurality of active columns of ternary CAM cells having exclusively locally masked data is globally masked during consecutive search operations. In alternative embodiments, the LPM-specific global mask GMASK_LPM<0:79> may be used to designate which data outputs of a bit/data line driver circuit are to be held in high impedance states (i.e., D=DB=float) or frozen at fixed data values (D, DB are held at 1,0 or D, DB are held at 0,1), during consecutive search operations.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A content addressable memory device, comprising:
   a CAM array having a plurality of active columns of ternary CAM cells therein; and
   a bit/data line driver circuit electrically coupled to said CAM array, said bit/data line driver circuit configured to apply an LPM-specific mask to incoming search words so that each of the plurality of active columns of ternary CAM cells having exclusively locally masked data in valid entry locations is globally masked during search operations.

2. The content addressable memory device of claim 1, wherein said bit/data line driver circuit comprises an LPM-specific global mask generator configured to receive write words to be added to said CAM array during respective write operations.

3. The content addressable memory device of claim 2, wherein said LPM-specific global mask generator comprises an LPM-specific global mask register configured to store the LPM-specific mask.

4. The content addressable memory device of claim 3, wherein said LPM-specific global mask generator comprises a local mask decoder configured to receive the write words to be added to said CAM array.

5. The content addressable memory device of claim 1, wherein said CAM array comprises a segmented sub-array of dedicated XY mask cells configured to retain two global mask bits per mask cell and a segmented sub-array of XY CAM cells therein.

6. The content addressable memory device of claim 5, wherein the segmented sub-array of dedicated XY mask cells comprises a mask assertion circuit electrically coupled to said a bit/data line driver circuit, said mask assertion circuit configured to pass global mask signals to said bit/data line driver circuit in response to a read mask operation.

7. A content addressable memory device, comprising:
   a CAM array having a plurality of active columns of ternary CAM cells therein; and
   a bit/data line driver circuit electrically coupled to said CAM array, said bit/data line driver circuit configured to apply a BM-specific mask to incoming search words so that each of the plurality of active columns of ternary CAM cells having exclusively locally masked data in valid entry locations is globally masked during search operations.

8. The content addressable memory device of claim 7, wherein said bit/data line driver circuit comprises a global mask generator configured to receive write words to be added to said CAM array during respective write operations.

9. The content addressable memory device of claim 8, wherein said global mask generator comprises a global mask register configured to store the BM-specific mask.

10. The content addressable memory device of claim 9, wherein said global mask generator comprises a local mask decoder configured to receive the write words to be added to said CAM array.

11. The content addressable memory device of claim 7, wherein said CAM array comprises a segmented sub-array of dedicated XY mask cells configured to retain two global mask bits per mask cell.

12. The content addressable memory device of claim 11, wherein the segmented sub-array of dedicated XY mask cells comprises a mask assertion circuit electrically coupled to said a bit/data line driver circuit, said mask assertion circuit configured to pass global mask signals to said bit/data line driver circuit in response to a read mask operation.

13. A content addressable memory device, comprising:
   a CAM array having a plurality of columns of ternary CAM cells therein; and
   a bit/data line driver circuit electrically coupled to said CAM array, said bit/data line driver circuit configured to logically combine incoming search words with a global mask that designates locations of active ones of the plurality of columns having exclusively locally masked CAM cells at valid entries in said CAM array.

14. The content addressable memory device of claim 13, wherein said bit/data line driver circuit comprises a global mask generator configured to receive write words to be added to said CAM array during respective write operations.

15. The content addressable memory device of claim 14, wherein said global mask generator comprises a global mask register configured to store the global mask.

16. The content addressable memory device of claim 15, wherein said global mask generator comprises a local mask decoder configured to receive the write words to be added to said CAM array.

17. The content addressable memory device of claim 13, wherein said CAM array comprises a segmented sub-array of dedicated XY mask cells configured to retain two global mask bits per mask cell.

18. The content addressable memory device of claim 17, wherein the segmented sub-array of dedicated XY mask cells comprises a mask assertion circuit electrically coupled to said a bit/data line driver circuit, said mask assertion circuit configured to pass global mask signals to said bit/data line driver circuit in response to a read mask operation.

19. A method of operating an integrated circuit device, comprising:
   generating a mask value that designates locations of active ones of a plurality of columns of a CAM array having exclusively locally masked CAM cells at valid entries in the CAM array.

20. The method of claim 19, further comprising the step of:
   updating a value of the global mask in response to writing an entry into the CAM array.

21. A content addressable memory (CAM) block, comprising logic configured to perform the following operation:

generating a mask value that designates locations of active ones of a plurality of columns of CAM cells in the CAM array block having exclusively locally masked CAM cells at valid entries in the CAM array block.

22. A content addressable memory device, comprising:

a CAM array having a plurality of active columns of ternary CAM cells therein; and a bit/data line driver circuit electrically coupled to said CAM array, said bit/data line driver circuit configured to apply a mask to incoming search words so that at least one pair of differential data lines associated with an active column of ternary CAM cells having exclusively locally masked data in valid entry locations is globally masked, floated or frozen during consecutive search operations.

* * * * *